United States Patent
Hasegawa et al.

(10) Patent No.: US 6,707,649 B2
(45) Date of Patent: Mar. 16, 2004

(54) MAGNETIC SENSING ELEMENT PERMITTING DECREASE IN EFFECTIVE ELEMENT SIZE WHILE MAINTAINING LARGE OPTICAL ELEMENT SIZE

(75) Inventors: Naoya Hasegawa, Niigata-ken (JP); Yasuo Hayakawa, Niigata-ken (JP)

(73) Assignee: Alps Electric Co., Ltd. (JP)

(*) Notice: Subject to any disclaimer, the term of this patent is extended or adjusted under 35 U.S.C. 154(b) by 34 days.

(21) Appl. No.: 10/103,358

(22) Filed: Mar. 20, 2002

(65) Prior Publication Data

US 2002/0135956 A1 Sep. 26, 2002

(30) Foreign Application Priority Data

Mar. 22, 2001 (JP) ........................................ 2001-081825

(51) Int. Cl.⁷ ................................................. G11B 5/39
(52) U.S. Cl. ................................................. 360/324.12
(58) Field of Search ........................ 360/324.12, 324.2, 360/314; 438/3; 257/9

(56) References Cited

U.S. PATENT DOCUMENTS

| 5,446,613 A | 8/1995 | Rottmayer .................. 360/319 |
| 5,576,914 A | 11/1996 | Rottmayer et al. .......... 360/324 |
| 5,880,912 A | 3/1999 | Rottmayer .................. 360/324 |
| 5,883,763 A | 3/1999 | Yuan et al. .................. 360/324 |
| 5,959,811 A | 9/1999 | Richardson ................. 360/322 |
| 5,961,848 A | 10/1999 | Jacquet et al. ................ 216/22 |
| 6,110,751 A * | 8/2000 | Sato et al. ....................... 438/3 |
| 6,178,074 B1 * | 1/2001 | Gill ........................... 360/324.2 |
| 6,249,407 B1 | 6/2001 | Aoshima et al. ......... 360/324.2 |
| 6,452,204 B1 * | 9/2002 | Ishiwata et al. ................ 257/9 |
| 6,473,275 B1 * | 10/2002 | Gill .............................. 360/314 |

FOREIGN PATENT DOCUMENTS

JP 06251875 A * 9/1994

* cited by examiner

*Primary Examiner*—Tianjie Chen
(74) *Attorney, Agent, or Firm*—Brinks Hofer Gilson & Lione

(57) ABSTRACT

A current limiting layer including a mixture of a conductive portion and an insulating portion is provided on the side (upper side) of a free magnetic layer which a sensing current reaches. This can decrease the effective element area while maintaining the large optical element area. Therefore, a magnetic sensing element can easily be formed by using a photolithography technique having the same degree of accuracy as a conventional technique, and a CPP type magnetic sensing element having high reproduced output can be manufactured.

18 Claims, 12 Drawing Sheets

MAGNETIC SENSING ELEMENT PERMITTING DECREASE IN EFFECTIVE ELEMENT SIZE WHILE MAINTAINING LARGE OPTICAL ELEMENT SIZE

BACKGROUND OF THE INVENTION

1. Field of the Invention

The present invention relates to a CPP (current perpendicular to the plane) type magnetic sensing element, and particularly to a magnetic sensing element permitting a decrease in the effective element size while maintaining the large optical element size, and permitting effective and easy improvement in reproduced output, and a method of manufacturing the same.

2. Description of the Related Art

FIG. 13 is a partial sectional view showing the structure of a conventional magnetic sensing element, as viewed from the side facing a recording medium.

In FIG. 13, reference numeral 1 denotes an underlying layer of Ta or the like, on which an antiferromagnetic layer 2 of PtMn or the like is formed. Furthermore, a pinned magnetic layer 3 made of NiFe or the like is formed on the antiferromagnetic layer 2, a nonmagnetic intermediate layer 4 made of Cu or the like is formed on the fixed magnetic layer 3, and a free magnetic layer 5 made of NiFe or the like is formed on the nonmagnetic intermediate layer 4. Also, a protecting layer 6 made of Ta or the like is formed on the free magnetic layer 5. A multilayer film 9 ranges from the underlying layer 1 to the protecting layer 6.

Magnetization of the pinned magnetic layer 3 is pinned in the Y direction shown in the drawing by an exchange anisotropic magnetic field with the antiferromagnetic layer 2.

Magnetization of the free magnetic layer 5 is oriented in the X direction shown in the drawing by a longitudinal bias magnetic field from each of hard bias layers 7 formed on both sides of the free magnetic layer 5 in the track width direction (the X direction shown in the drawing).

As shown in FIG. 13, electrode layers 8 are formed on the hard bias layers 7. The track width Tw is determined by the length of the upper surface of the free magnetic layer 5 in the track width direction (the X direction).

In the magnetic sensing element shown in FIG. 13, the direction of a current flow is referred to as a "CIP (current in the plane) type" in which the current flows in substantially parallel to the film plane of each of the layers of the multilayer film 9. This type is schematically shown in FIG. 14.

As shown in FIG. 14, in a multilayer film ranging from an antiferromagnetic layer to a free magnetic layer, the width of the upper surface of the free magnetic layer is the track width Tw, the thickness of the multilayer film is T, and the length of the multilayer film in the height direction (the Y direction shown in the drawing) is MRh.

When the current density ($J=I/(MRh \times T)$) and the thickness T are constant, and the track width Tw and the height length MRh are reduced to 1/S, the resistance value R of the multilayer film is constant, and thus the change in resistance $\Delta R$ is also constant. However, the sensing current I is reduced to 1/S, and thus output $\Delta V$ ($=\Delta R \times I$) is also reduced to 1/S.

On the other hand, when the track width Tw and the height length MRh are reduced to 1/S with a constant heating value P, the resistance value R of the multilayer film is constant, and thus the change in resistance $\Delta R$ is also constant. The sensing current I is also constant, and thus output $\Delta V$ is a constant value.

In a CPP (current perpendicular to the plane) type magnetic sensing element in which the sensing current flows perpendicularly to the film plane of each of the layers of the multilayer film, the output $\Delta V$ changes as follows:

FIG. 15 is a schematic drawing of a CPP type magnetic sensing element. Like in FIG. 14, in FIG. 15, the track width determined by the width of the upper surface of a free magnetic layer of a multilayer film is denoted by Tw, the thickness of the multilayer film is T, and the length of the multilayer film in the height direction (the Y direction shown in the drawing) is MRh.

Like in the CIP type, when the current density ($J=I/(Tw \times MRh)$) and the thickness T are constant, and the track width Tw and the height length MRh are reduced to 1/S, the resistance value R of the multilayer film is increased $S^2$ times, and thus the change in resistance $\Delta R$ is also increased $S^2$ times. However, the sensing current I is reduced to $1/S^2$, and thus output $\Delta V$ ($=\Delta R \times I$) is constant.

On the other hand, when the track width Tw and the height length MRh are reduced to 1/S with a constant heating value P, the resistance value R of the multilayer film is increased $S^2$ times, and thus the change in resistance $\Delta R$ is also increased $S^2$ times. The sensing current I is reduced to 1/S, and thus output $\Delta V$ is increased S times.

In this way, as narrowing of the element size advances, reproduced output V of the CPP type can be more increased than the CIP type. Therefore, the CPP type is expected to appropriately comply with narrowing of the element size with increases in the recording density in the future.

However, it was found that unless the track width Tw and the height length MRh are 0.1 $\mu$m or less (i.e., the element area is 0.01 $\mu$m$^2$ or less), the CPP type magnetic sensing element cannot effectively produce higher reproduced output than the CIP type.

The element size will possibly gradually decrease with future increases in the recording density. However, with the accuracy of the present photolithography techniques, it is very difficult to form a magnetic sensing element having a 0.1 $\mu$m square element area. Also, with an excessively small element size, a leakage magnetic field from a recording medium cannot be effectively sensed by the magnetic sensing element, thereby possibly causing deterioration in reproduced output and deterioration in stability of a reproduced waveform.

SUMMARY OF THE INVENTION

Accordingly, the present invention has been achieved for solving the above problem of the conventional technique, and an object of the present invention is to provide a magnetic sensing element permitting a decrease in the effective element size while maintaining the large optical element size, and permitting effective and easy improvement in reproduced output, and a method of manufacturing the magnetic sensing element.

The present invention provides a magnetic sensing element comprising a multilayer film comprising an antiferromagnetic layer, a pinned magnetic layer, a nonmagnetic intermediate layer and a free magnetic layer, wherein a current flows perpendicularly to the film plane of each of the layers of the multilayer film, and a current limiting layer comprising a mixture of an insulating portion and a conductive portion is provided on at least one of the upper and lower surfaces of the free magnetic layer directly or through another layer.

The magnetic sensing element of the present invention is a CPP type in which a sensing current flows perpendicularly to the film plane of each of the layers of the multilayer film.

Therefore, the sensing current perpendicularly flows in the current limiting layer. However, in the present invention, the current limiting layer provided on at least one of the upper and lower surfaces of the free magnetic layer comprises a mixture of the insulating portion and the conductive portion, and thus the sensing current flows only in the conductive portion.

Therefore, the sensing current flowing from an electrode layer to the free magnetic layer through the current limiting layer locally flows only in a portion of the free magnetic layer corresponding to the conductive portion to locally increase the current density in this portion.

Therefore, in the present invention, even when the element area (referred to as an "optical element area") of the free magnetic layer in the direction parallel to the film planes is formed in the same large size as a conventional element, the element area (referred to as an "effective element area") in which the sensing current actually flows in the free magnetic layer to contribute to a magnetoresistive effect can be decreased. Thus, even when a magnetic sensing element having a large optical element size is formed by using a photolithography technique having the same degree of accuracy as conventional photolithography, a CPP type magnetic sensing element producing high reproduced output can easily be formed.

Also, the element size can be made the same as the conventional element, and thus the magnetic sensing element can effectively sense an external magnetic field from a recording medium, thereby permitting improvements in reproduced output and stability of a reproduced waveform.

In the present invention, the current limiting layer is preferably provided at least on the current arrival surface of the free magnetic layer directly or through another layer. This can appropriately narrow the path of the sensing current to decrease the effective element area, thereby permitting the manufacture of a CPP type magnetic sensing element producing high reproduced output.

In the present invention, the insulating portion of the current limiting layer preferably comprises an insulating material layer having a plurality of holes provided therein to pass through at least the current limiting layer, and the holes are preferably filled with a conductive material layer, which constitutes the conductive portion.

In the present invention, the insulating material layer preferably comprises an oxide film or a nitride film. The oxide film preferably comprises an insulating material composed of an oxide of at least one of Al, Si, Ti, Zr, Hf, Cr, Ta, V, Nb, Mo, W, Fe, Ni and Co.

The nitride film preferably comprises an insulating material composed of a nitride of at least one of Al, Si, Ti, Zr, Hf, Cr, Ta, V, Nb, Mo, W, Fe, Ni and Co.

Alternatively, the conductive portion of the current limiting layer preferably comprises conductive grains which are dispersed in an insulating material layer constituting the insulating portion.

For example, the current limiting layer preferably comprises a film structure in which microcrystal grains constituting the conductive portion and mainly composed of Fe are dispersed in an amorphous material constituting the insulating portion and containing a compound of O or N with at least one element M selected from Ti, Zr, Hf, Nb, Ta, Mo, W, and the rare earth elements.

In this case, the current limiting layer preferably has a composition represented by the formula $Fe_a M_b O_c$ wherein the composition ratios a, b and c by atomic % are $40 \leq a \leq 50$, $10 \leq b \leq 30$ and $20 \leq c \leq 40$, respectively, and satisfy the relationship $a+b+c=100$.

Alternatively, the current limiting layer preferably has a composition represented by the formula $Fe_d M_e N_f$ wherein the composition ratios d, e and f by atomic % are $60 \leq d \leq 70$, $10 \leq e \leq 15$ and $19 \leq f \leq 25$, respectively, and satisfy the relationship $d+e+f=100$.

In the present invention, the insulating portion of the current limiting layer may comprise insulating grains dispersed in a conductive material layer constituting the conductive portion.

In the film structure of the current limiting layer, therefore, the insulating portion and the conductive portion can be appropriately mixed, thereby permitting an attempt to appropriately decrease the effective element size.

A method of manufacturing a magnetic sensing element of the present invention comprises the following steps:

(a) The step of depositing in turn a first electrode layer, an antiferromagnetic layer, a pinned magnetic layer, a nonmagnetic intermediate layer and a free magnetic layer to form a multilayer film, and further depositing an insulating material layer on the free magnetic layer by sputtering, in which a plurality of holes are formed in the insulating material layer so as to pass through the insulating material layer.

(b) The step of depositing a conductive material layer on the insulating material layer by sputtering, in which the holes formed in the insulating material layer are filled with the conductive material layer.

(c) The step of forming a second electrode layer on a current limiting layer comprising the insulating material layer and the conductive material layer.

By these steps, the current limiting layer comprising the insulating material layer having a plurality of holes formed to pass through the insulating material layer, and the conductive material layer filling in the holes can be easily formed on the free magnetic layer.

In the present invention, in depositing the insulating material layer by sputtering in the step (a), the insulating material layer is preferably formed as a discontinuous film on the free magnetic layer. This enables the easy formation of a plurality of holes passing through the insulating material layer. In order to form the insulating material layer as the discontinuous film, the selection of the material and sputtering conditions are important. The sputtering conditions include a substrate temperature, Ar gas pressure, the distance between a substrate and a target, etc.

In the present invention, the insulating material layer is preferably deposited by sputtering an insulating material composed of an oxide of at least one of Al, Si, Ti, Zr, Hf, Cr, Ta, V, Nb, Mo, W, Fe, Ni and Co.

Alternatively, the insulating material layer is preferably deposited by sputtering an insulating material composed of a nitride of at least one of Al, Si, Ti, Zr, Hf, Cr, Ta, V, Nb, Mo, W, Fe, Ni and Co.

In another aspect of the present invention, a method of manufacturing a magnetic sensing element comprises the following steps:

(d) The step of depositing in turn a first electrode layer, an antiferromagnetic layer, a pinned magnetic layer, a nonmagnetic intermediate layer and a free magnetic layer to form a multilayer film, and further depositing, on the free magnetic layer by sputtering, a current limiting layer having a composition represented by the formula $Fe_aM_bO_c$ (wherein M is at least one element selected from Ti, Zr, Hf, Nb, Ta, Mo, W, and the rare earth elements) wherein the composition ratios a, b and c by atomic % are $40 \leq a \leq 50$, $10 \leq b \leq 30$ and $20 \leq c \leq 40$, respectively, and satisfy the relationship $a+b+c=100$, and having a film structure in which microcrystal grains composed of Fe as a main component are dispersed in an amorphous material containing a compound of the element M and O.

(e) The step of forming a second electrode layer on the current limiting layer.

Alternatively, in the step (d), instead of $Fe_aM_bO_c$, a current limiting layer having a composition represented by the formula $Fe_dM_eO_f$ (wherein M is at least one element selected from Ti, Zr, Hf, Nb, Ta, Mo, W, and the rare earth elements) may be deposited by sputtering, in which the composition ratios d, e and f by atomic % are $60 \leq d \leq 70$, $10 \leq e \leq 15$ and $19 \leq f \leq 25$, respectively, and satisfy the relationship $d+e+f=100$, and the current limiting layer has a film structure in which microcrystal grains composed of Fe as a main component are dispersed in an amorphous material containing a compound of the element M and N.

In the above manufacturing method, the current limiting layer can easily be formed on the free magnetic layer, in which the microcrystal grains composed of Fe as a main component are dispersed in the amorphous material containing an O or N compound with at least one element M selected from Ti, Zr, Hf, Nb, Ta, Mo, W, and the rare earth elements.

In the present invention, the multilayer film may be formed by depositing in turn a first electrode layer, a current limiting layer, a free magnetic layer, a nonmagnetic intermediate layer, a pinned magnetic layer and an antiferromagnetic layer.

DESCRIPTION OF THE PREFERRED EMBODIMENTS

Figure 1:
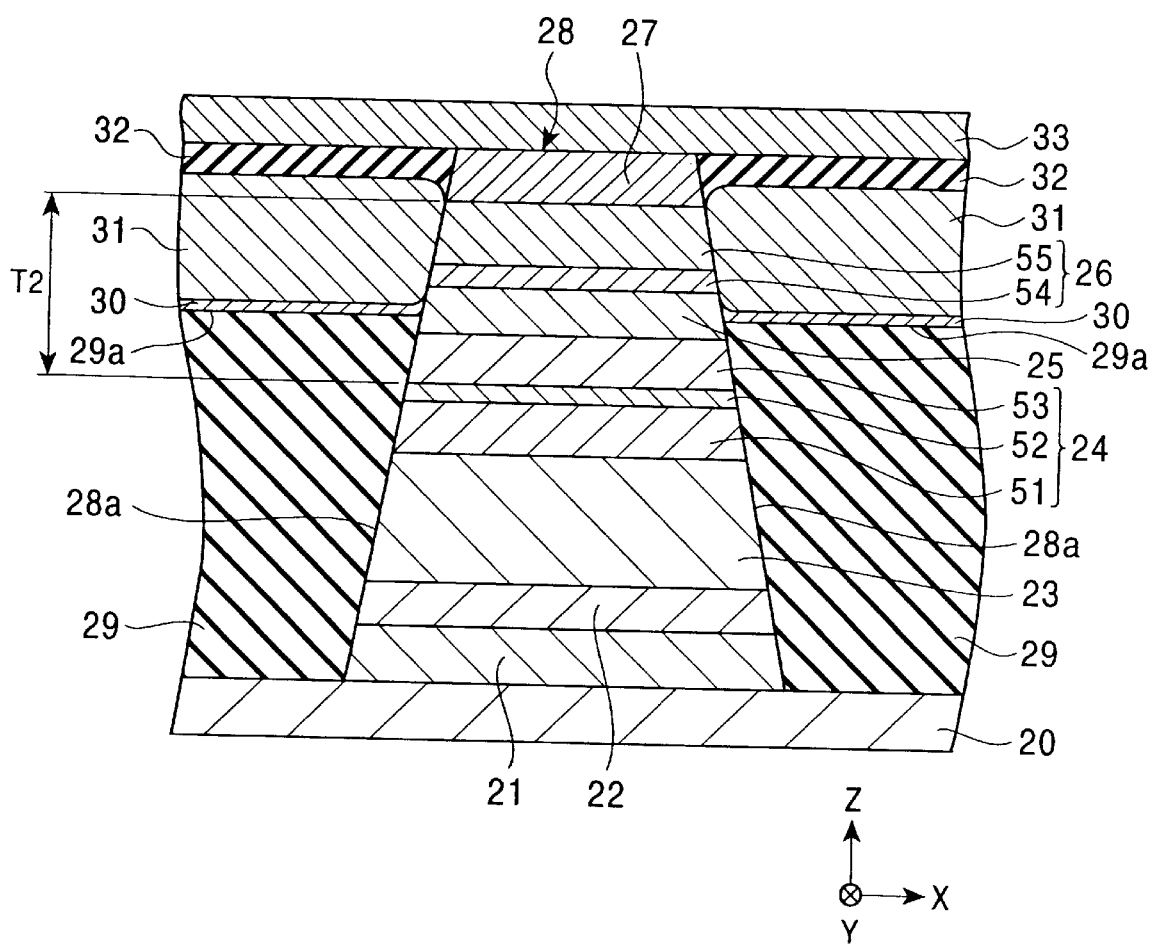
FIG. 1 is a partial sectional view of a magnetic sensing element according to a first embodiment of the present invention, as viewed from the side facing a recording medium.

FIG. 1 is a partial sectional view showing the entire structure of a magnetic sensing element (a single spin-valve magnetoresistive element) according to a first embodiment of the present invention, as viewed from the side facing a recording medium. FIG. 1 is a cut-away view showing only the central portion of the element in the X direction shown in the drawing.

Furthermore, shield layers (not shown in the drawing) are provided above and below the magnetic sensing element shown in FIG. 1, with gap layers (not shown in the drawing) provided therebetween to form a MR head including the magnetic sensing element, the gap layers and the shield layers.

The first and second electrode layers 20 and 33 shown in FIG. 1 may also be used as the gap layers, or when the electrode layers 20 and 33 are made of a magnetic material, both layers may also be used as the shield layers.

The MR head is adapted for reproducing external signals recorded on the recording medium. In the present invention, a recording inductive head may be laminated on the MR head. The shield layer (upper shield layer) formed above the magnetic sensing element may also be used as a lower core layer of the inductive head.

The MR head is formed on the trailing-side end surface of a slider made of, for example, alumina-titanium carbide ($Al_2O_3$—TiC). The surface of the slider opposite to the surface facing the recording medium is bonded to an elastically deformable support member made of a stainless steel material or the like to form a magnetic head device.

In FIG. 1, the first electrode layer 20 is made of, for example, α-Ta, Au, Cr, Cu (copper), W (tungsten), or the like.

An underlying layer 21 is formed at the center of the upper surface of the first electrode layer 20. The underlying layer 21 is preferably made of at least one of Ta, Hf, Nb, Zr, Ti, Mo, and W. The underlying layer 21 has a thickness of about 50 Å. The underlying layer 21 is not necessarily formed.

Then, a seed layer 22 is formed on the underlying layer 21. The seed layer 22 mainly comprises a face-centered cubic crystal in which a (111) plane is preferentially oriented in parallel with the interface with the antiferromagnetic layer 23 described below. The seed layer 22 is preferably made of a NiFe alloy or Ni—Fe—Y alloy (wherein Y is at least one selected from Cr, Rh, Ta, Hf, Nb, Zr, and Ti). By forming the seed layer 22 made of such a material on the underlying layer 21 made of Ta or the like, the (111) plane is easily preferentially oriented in parallel with the interface with the antiferromagnetic layer 23. The seed layer 22 has a thickness of, for example, about 30 Å.

The magnetic sensing element of the present invention is a CPP type in which a sensing current flows perpendicularly to the film plane of each of the layers, and thus the sensing current must appropriately flow through the seed layer 22. Therefore, the seed layer 22 is preferably made of a material having low resistivity. Namely, in the CPP type, the seed layer 22 is preferably made of a material with low resistivity, such as a NiFe alloy or the like. The seed layer 22 is not necessarily formed.

Next, the antiferromagnetic layer 23 is formed on the seed layer 22. The antiferromagnetic layer 23 is preferably made of an antiferromagnetic material containing element X (X is at least one element selected from Pt, Pd, Ir, Rh, Ru, and Os) and Mn. Alternatively the antiferromagnetic layer 23 is preferably made of an antiferromagnetic material containing element X and element X' (X' is at least one element selected from Ne, Ar, Kr, Xe, Be, B, C, N, Mg, Al, Si, P, Ti, V, Cr, Fe, Co, Ni, Cu, Zn, Ga, Zr, Nb, Mo, Ag, Cd, Sn, Hf, Ta, W, Re, Au, Pb, and the rare earth elements) and Mn.

These antiferromagnetic materials have excellent corrosion resistance and a high blocking temperature, and can produce a high exchange anisotropic magnetic field at the interface with the pinned magnetic layer 24 described below. The antiferromagnetic layer 23 preferably has a thickness of 80 Å to 300 Å.

Then, the pinned magnetic layer 24 is formed on the antiferromagnetic layer 23. In this embodiment, the pinned magnetic layer 24 has a three-layer structure.

In the structure of the pinned magnetic layer 24, reference numerals 51 and 53 each denote a magnetic layer made of, for example, Co, CoFe, NiFe, CoFeNi, or the like, and an intermediate layer 52 made of Ru or the like is interposed between the magnetic layers 51 and 53. This structure brings the magnetization directions of the magnetic layers 51 and 53 into an antiparallel state. This is referred to as a so-called "synthetic ferrimagnetic structure".

Therefore, heat treatment in a magnetic field produces an exchange anisotropic magnetic field between the antiferromagnetic layer 23 and the magnetic layer 51 of the pinned magnetic layer 24, which is in contact with the antiferromagnetic layer 23. For example, when magnetization of the magnetic layer 51 is pinned in the height direction (the Y direction shown in the drawing), magnetization of the other magnetic layer 53 is pinned in the direction opposite to the height direction (opposite to the Y direction) due to RKKY interaction. This structure can stabilize magnetization of the pinned magnetic layer 24, and apparently increase the exchange anisotropic magnetic field produced at the interface between the pinned magnetic layer 24 and the antiferromagnetic layer 23.

For example, each of the magnetic layers 51 and 53 has a thickness of about 10 to 70 Å. The intermediate layer 52 has a thickness of about 3 to 10 Å.

The magnetic layers 51 and 53 are made of different materials having different thicknesses so that both layers have different magnetic moments per unit area. The magnetic moment is set by saturation magnetization Ms×thickness t. For example, when the magnetic layers 51 and 53 are made of the same material having the same composition, the magnetic layers 51 and 53 are formed in different thicknesses so that the magnetic layers 51 and 53 have different magnetic moments. As a result, the magnetic layers 51 and 53 can be appropriately provided with the synthetic ferrimagnetic structure.

In the present invention, the pinned magnetic layer 24 may comprise a single-layer film of a NiFe alloy, a NiFeCo alloy, or a CoFe alloy, or a laminated film of these alloys.

Furthermore, a nonmagnetic intermediate layer 25 is formed on the pinned magnetic layer 24. The nonmagnetic intermediate layer 25 is made of an electrically conductive material having low electric resistance, for example, Cu or the like. The nonmagnetic intermediate layer 25 has a thickness of, for example, about 25 Å.

Next, a free magnetic layer 26 is formed on the nonmagnetic intermediate layer 25. The free magnetic layer 26 has a two-layer structure in which a Co film 54 is preferably formed on the side facing the nonmagnetic intermediate layer 25. This structure can prevent diffusion of metal elements at the interface with the nonmagnetic intermediate layer 25, and increase the rate (ΔGMR) of change in resistance. Also, a magnetic layer 55 made of a NiFe alloy, a CoFe alloy, Co, a CoNiFe alloy, or the like is preferably formed on the Co film 54. The total thickness of the free magnetic layer 26 is preferably about 20 to 100 Å.

The free magnetic layer 26 may comprise a single-layer structure using any one of the above magnetic materials.

Furthermore, a current limiting layer 27 is formed on the free magnetic layer 26. The film structure of the current limiting layer 27 will be described in detail later.

In the present invention, the multilayer film 28 ranging from the underlying layer 21 to the current limiting layer 27 has both side surfaces 28a in the track width direction (the X direction shown in the drawing), which are continuous inclined surfaces, and thus has a substantially trapezoidal shape.

As shown in FIG. 1, insulating layers 29 are formed on both sides of the multilayer film 28 in the track width direction. The insulating layers 29 are made of a general insulating material, for example, $Al_2O_3$, $SiO_2$, or the like.

The upper surfaces 29a of the insulating layers 29 are preferably lower (in the direction opposite to the Z direction shown in the drawing) than the bottom of the free magnetic layer 26.

Furthermore, bias underlying layers 30 are formed on the insulating layers 29, and hard bias layers 31 are formed on the bias underlying layers 30. The hard bias layers 31 are formed at positions corresponding to both sides of the free magnetic layer 26. The hard bias layers 31 are magnetized in the track width direction (the X direction shown in the drawing) so that magnetization of the free magnetic layer 26 is oriented in the X direction by a longitudinal bias magnetic field from the hard bias layers 31.

The bias underlying layers 30 are provided for improving the properties (coercive force Hc, and remanence ratio S) of the hard bias layers 31.

In the present invention, each of the bias underlying layers 30 preferably comprises a metal film having a body-centered cubic crystal structure (bcc structure). In this case, in preferred crystal orientation of the bias underlying layers 30, a (100) plane is preferentially oriented.

The hard bias layers 31 are made of a CoPt alloy, a CoPtCr alloy, or the like. The crystal structure of these alloys comprises a single phase of a hexagonal close packed structure (hcp) or a mixed phase of a face-centered structure cubic structure (fcc) and a hexagonal close packed structure (hcp).

In this case, the bias underlying layers 30 each comprising the above metal film have a lattice constant close to that of the hcp structure of a CoPt alloy which constitutes the hard bias layers 31. Therefore, the CoPt alloy is difficult to form the fcc structure, but it readily forms the hcp structure. In the hcp structure, the c axis is preferentially oriented in the interface between the CoPt alloy and the bias underlying layer. In the hcp structure, with a magnetic field applied to the hard bias layers 31, high coercive force Hc is produced because of great magnetic anisotropy in the c axis direction, as compared with the fcc structure. Furthermore, since the c axis of the hcp structure is preferentially oriented in the interface between the CoPt alloy and the bias underlying layer 30, remanent magnetization increases to decrease the remanence ratio S determined by remanent magnetization/saturation magnetic flux density. As a result, the properties of the hard bias layers 31 can be improved, and the bias magnetic field produced from the hard bias layers 31 can be increased.

In the present invention, a metal film having a body-centered cubic crystal structure (bcc structure) is preferably made of at least one element of Cr, W, Mo, V, Mn, Nb, and Ta.

In the present invention, the bias underlying layers 30 are preferably formed only below the hard bias layers 31, but may be slightly interposed between both side surfaces 28a of the multilayer film 28 and the hard bias layers 31. The bias underlying layers 30 formed on both side surfaces 28a of the multilayer film 28 preferably have a thickness of 1 nm or less in the track width direction (the X direction).

As a result, the hard bias layers 31 can be magnetically connected to the free magnetic layer 26, thereby causing no problem of a buckling phenomenon in which the ends of the free magnetic layer 26 are affected by a demagnetizing field. Therefore, the magnetic domains of the free magnetic layer 26 can be easily controlled.

As shown in FIG. 1, insulating layers 32 are formed on the hard bias layers 31. The insulating layers 32 are made of a general insulating material such as $Al_2O_3$, $SiO_2$, or the like.

In this embodiment, the upper surfaces of the insulating layers 32 and the upper surface of the current limiting layer 27 are planarized to a same plane, but the upper surfaces of the insulating layers 32 need not be coplanar with the upper surface of the current limiting layer 27.

Then, the second electrode layer 33 is formed on the insulating layers 32 and the current limiting layer 27. Like the first electrode layer 20, the second electrode layer 33 is made of, for example, α-Ta, Au, Cr, Cu (copper), W (tungsten), or the like.

In this embodiment, the sensing current flows from the second electrode layer 33 to the first electrode layer 20, but the sensing current may flows from the first electrode layer 20 to the second electrode layer 33. Therefore, the sensing current flows perpendicularly to the film plane of each of the layers of the multilayer film 28. This direction of the sensing current flow is referred to as a "CPP type".

In this magnetic sensing element, when the sensing current is supplied to the pinned magnetic layer 24, the nonmagnetic intermediate layer 25 and the free magnetic layer 26, and a leakage magnetic field is applied in the Y direction from the recording medium such as a hard disk or the like, which moves in the Z direction, magnetization of the free magnetic layer 26 is changed from the X direction to the Y direction. As a result, the electric resistance changes (referred to as a "magnetoresistive effect") based on the relation between the change in the magnetization direction of the free magnetic layer 26 and the pinned magnetization direction of the pinned magnetic layer 24. Thus, the leakage magnetic field from the recording medium is sensed by a change in the voltage based on the change in the electrical resistance value.

In the present invention, as shown in FIG. 1, the current limiting layer 27 is formed between the free magnetic layer 26 and the second electrode layer 33.

Figure 7:
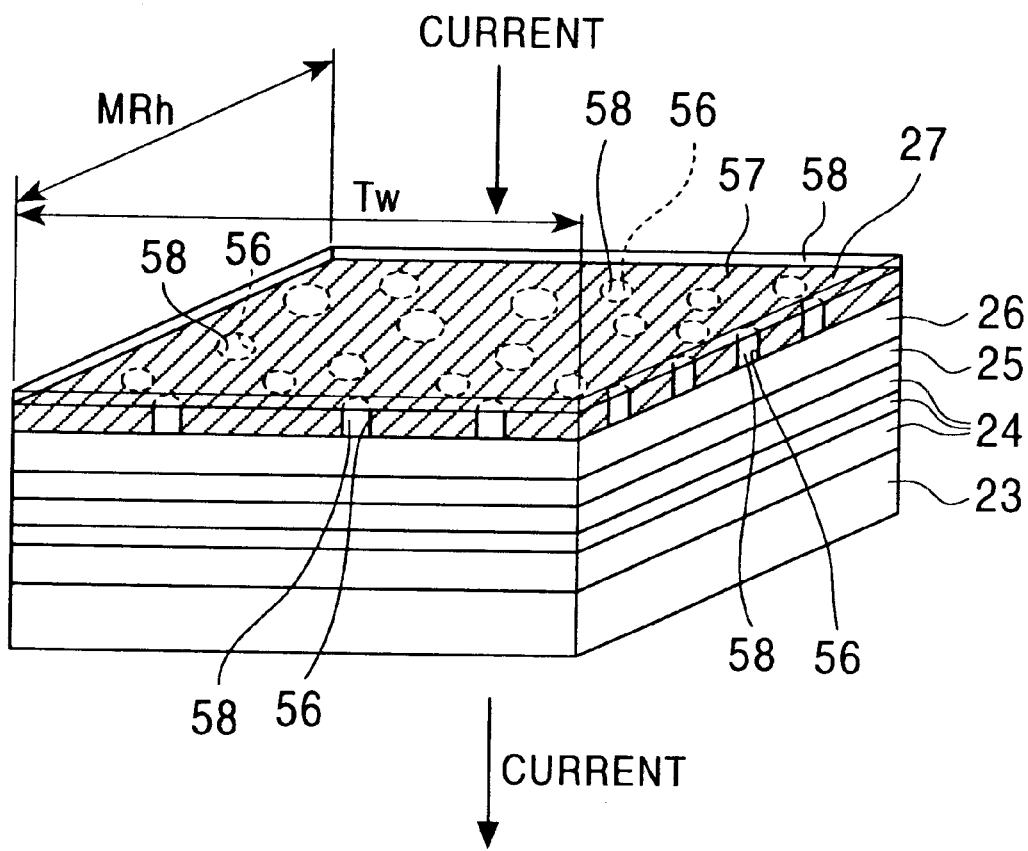
FIG. 7 is a partial schematic drawing showing a film structure comprising a multilayer film and a current limiting layer according to the present invention.

In the present invention, the current limiting layer 27 has, for example, the film structure shown in FIG. 7. FIG. 7 is a partial schematic drawing showing the antiferromagnetic layer 23, the pinned magnetic layer 24, the nonmagnetic intermediate layer 25, the free magnetic layer 26, and the current limiting layer 27.

As shown in FIG. 7, the current limiting layer 27 comprises, as a base material, an insulating material layer (insulating portion) 57 having a plurality of holes 56 formed therein. At least some of the holes 56 pass through the insulating material layer 57.

As shown in FIG. 7, a conductive material layer (conductive portion) 58 is formed on the insulating material layer 57. The conductive material layer 58 is also formed in the holes 56 formed in the insulating material layer 57 so that the holes 56 are filled with the conductive material layer 58. In FIG. 7, only some of the holes and the conductive material layer are denoted by reference numerals 56 and 58, respectively, for the sake of simplification of the drawing.

In this structure, the insulating material layer 57 preferably comprises an oxide film or a nitride film. The oxide film is preferably made of an insulating material composed of an oxide of at least one of Al, Si, Ti, Zr, Hf, Cr, Ta, V, Nb, Mo, W, Fe, Ni and Co. The nitride film is preferably made of an insulating material composed of a nitride of at least one of Al, Si, Ti, Zr, Hf, Cr, Ta, V, Nb, Mo, W, Fe, Ni and Co.

When the thin oxide film or nitride film is deposited on the free magnetic layer 26, a discontinuous film is easily formed due to aggregation during sputtering deposition. In the discontinuous film, the holes 56 passing through the insulating material layer 57 are easily formed, as shown in FIG. 7.

In order to form the discontinuous film, not only the selection of the material but also sputtering conditions are important. The sputtering conditions for forming the insulating material layer 57 comprising the discontinuous film include a substrate temperature of as low as about 20 to 200° C., an Ar gas pressure of as high as about 10 to 50 mTorr (1.3 to 6.7 Pa), and a substrate-to-target distance of about 200 to 300 mm.

The sputtering deposition can be performed by, for example, any one of a RF sputtering process, a RF magnetron sputtering process, a DC magnetron sputtering process, an ion beam sputtering process, a long slow sputtering process, and a collimation sputtering process, or a combination thereof.

Next, the conductive material layer 58 is formed by using a general conductive material, for example, α-Ta, Au, Cr, Cu (copper), W (tungsten), or the like, like the electrode layers 20 and 33.

As described above, in the present invention, the current limiting layer 27 containing the insulating portion and the conductive portion is provided on the free magnetic layer 26, and thus the effect below can be expected.

In the CPP type magnetic sensing element of the present invention, the sensing current flowing from the second electrode layer 33 flows through the current limiting layer 27 perpendicularly to the film plane. However, in the present invention, the current limiting layer 27 has a structure in which the holes 56 formed in the insulating material layer (insulating portion) 57 are filled with the conductive material layer (conductive portion) 58, and thus the sensing current flows only through the conductive material layer 58.

Therefore, the sensing current flowing from the second electrode layer 33 to the free magnetic layer 26 through the current limiting layer 27 locally flows only through the portion of the free magnetic layer 26, which corresponds to the conductive material layer 58, to locally increase the current density in this portion.

Therefore, in the present invention, even when the free magnetic layer 26 is formed with substantially the same element area (referred to as the "optical element area") as a conventional element in parallel to the film plane, the element area (referred to as the "effective element area") in which the sensing current actually flows through the free magnetic layer 26 to contribute to the magnetoresistive effect can be decreased. Therefore, even when the magnetic sensing element having a large optical element size is formed by using a photolithography technique having the same degree of accuracy as a conventional technique, a CPP type magnetic sensing element producing high reproduced output can easily be formed.

As described above, in the present invention, a magnetic sensing element having substantially the same element area as a conventional element can be formed. Specifically, a magnetic sensing element having a track width Tw of 0.15 to 0.3 $\mu$m, and a length MRh of 0.15 to 0.3 $\mu$m in the height direction can be formed, and thus an optical element area can be increased to 0.02 to 0.09 $\mu m^2$.

In the present invention, the effective element area is preferably 0.01 $\mu m^2$ or less. The effective element area can be determined by, for example, multiplying the optical element area (Tw×MRh) by the opening ratio of the holes 56. This can be roughly determined from a difference between the resistance value of a single GNR film and the resistance value of the entire element including an electrode.

In the present invention, the optical element area is substantially the same as a conventional element, and thus the magnetic sensing element can effectively sense an external magnetic field from the recording medium. Therefore, a CPP type magnetic sensing element having high sensitivity and excellent reproducing characteristics can be manufactured.

The current limiting layer 27 shown in FIG. 7 comprises the insulating material layer 57 having a plurality of holes 56 formed therein, and the conductive material layer 58 filling in the holes 56. However, in the present invention, the current limiting layer 27 may have the film structure below.

For example, a target of an insulating material and a target of a conductive material are prepared, and both targets are simultaneously sputtered to form, on the free magnetic layer 26, the current limiting layer 27 in which particles of the insulating material and the conductive material are mixed.

In a specific film structure, the conductive portion of the current limiting layer comprises conductive particles which are dispersed in the insulating material layer constituting the insulating portion.

An example of the current limiting layer 27 having the above film structure is one in which microcrystal grains mainly composed of Fe and constituting the conductive portion are dispersed in an amorphous material constituting the insulating portion and containing an O or N compound of at least one element M selected from Ti, Zr, Hf, Nb, Ta, Mo, W, and the rare earth elements.

The current limiting layer 27 preferably has a composition represented by the formula $Fe_aM_bO_c$ wherein the composition ratios a, b and c by atomic % are $40 \leq a \leq 50$, $10 \leq b \leq 30$ and $20 \leq c \leq 40$, respectively, and satisfy the relationship a+b+c=100.

Alternatively, the current limiting layer 27 preferably has a composition represented by the formula $Fe_dM_eO_f$ wherein the composition ratios d, e and f by atomic % are $60 \leq d \leq 70$, $10 \leq e \leq 15$ and $19 \leq f \leq 25$, respectively, and satisfy the relationship d+e+f=100.

The current limiting layer 27 can be formed by, for example, preparing a target of Fe and a target of $HfO_2$, and sputtering the two targets. This method can form the current limiting layer 27 in which many microcrystal grains composed of bcc Fe as a main component are precipitated in an amorphous matrix.

Sputtering deposition can be performed by, for example, a RF sputtering process, a RF magnetron sputtering process, a DC magnetron sputtering process, an ion beam sputtering process, a long slow sputtering process, a collimation sputtering process, or a combination thereof.

Alternatively, the current limiting layer 27 may have a film structure in which the insulating portion comprises insulating particles dispersed in the conductive material layer constituting the conductive portion.

As the conductive particles, particles of a general conductive material such as Cu or the like can also be used, and as the insulating particles, particles of a general insulating material such as $Al_2O_3$ or the like can also be used.

A description will now be made of the thickness of the magnetic sensing element of the present invention.

In the present invention, the total thickness T2 (refer to FIG. 1) of the pinned magnetic layer 24 (in FIG. 1, the magnetic layer 53 substantially contributing the magnetoresistive effect), the nonmagnetic intermediate layer 25 and the free magnetic layer 26 is preferably 60 Å to 300 Å. For example, the thickness of the pinned magnetic layer 24 is about 20 Å, the thickness of the nonmagnetic intermediate layer 25 is about 20 Å, and the thickness of the free magnetic layer 26 is about 30 Å.

When the total thickness T2 of the pinned magnetic layer 24, the nonmagnetic intermediate layer 25 and the free magnetic layer 26 is 60 Å to 300 Å, the total thickness T2 becomes substantially the same as or slightly smaller than the mean free path of conduction electrons. Therefore, the conduction electrons can pass through the free magnetic layer 26 without being scattered therein to improve the rate of change in resistance (ΔMR) of the magnetic sensing element. With a total thickness T2 of less than 60 Å, reproduced output is undesirably decreased.

In the magnetic sensing element shown in FIG. 1, the sensing current flows from the second electrode layer 33 to the first electrode layer 20, or in the reverse direction, and the current limiting layer 27 is formed on the surface side (upper side) of the free magnetic layer 26 which the sensing current reaches. Therefore, the sensing current is effectively narrowed in the current limiting layer 27 to decrease the effective element area, thereby permitting the manufacture of the CPP type magnetic sensing element having high reproduced output.

A description will now be made of the characteristics of the film structure of the magnetic sensing element shown in FIG. 1.

In the magnetic sensing element shown in FIG. 1, the hard bias layers 31 are provided on both sides of the free magnetic layer 26 in the track width direction (the X direction shown in the drawing), and the insulating layers 29 and 32 are provided above and below the hard bias layers 31.

Therefore, the sensing current flowing between the first electrode layer 20 and the second electrode layer 33 less shunts to both side regions of the multilayer film 28 ranging from the underlying layer 21 to the current limiting layer 27, thereby causing the sensing current to appropriately flow through the multilayer film 28 to obtain high reproduced output.

When the total thickness T2 is less than the mean free path of the conduction electrons, the conduction electrons perpendicularly flow and reach directly the other electrode layer without a change in the direction. In this case, either of the insulating layers 29 and 32 may be omitted.

A description will be made of film structures other than that of the magnetic sensing element shown in FIG. 1.

Figure 2:
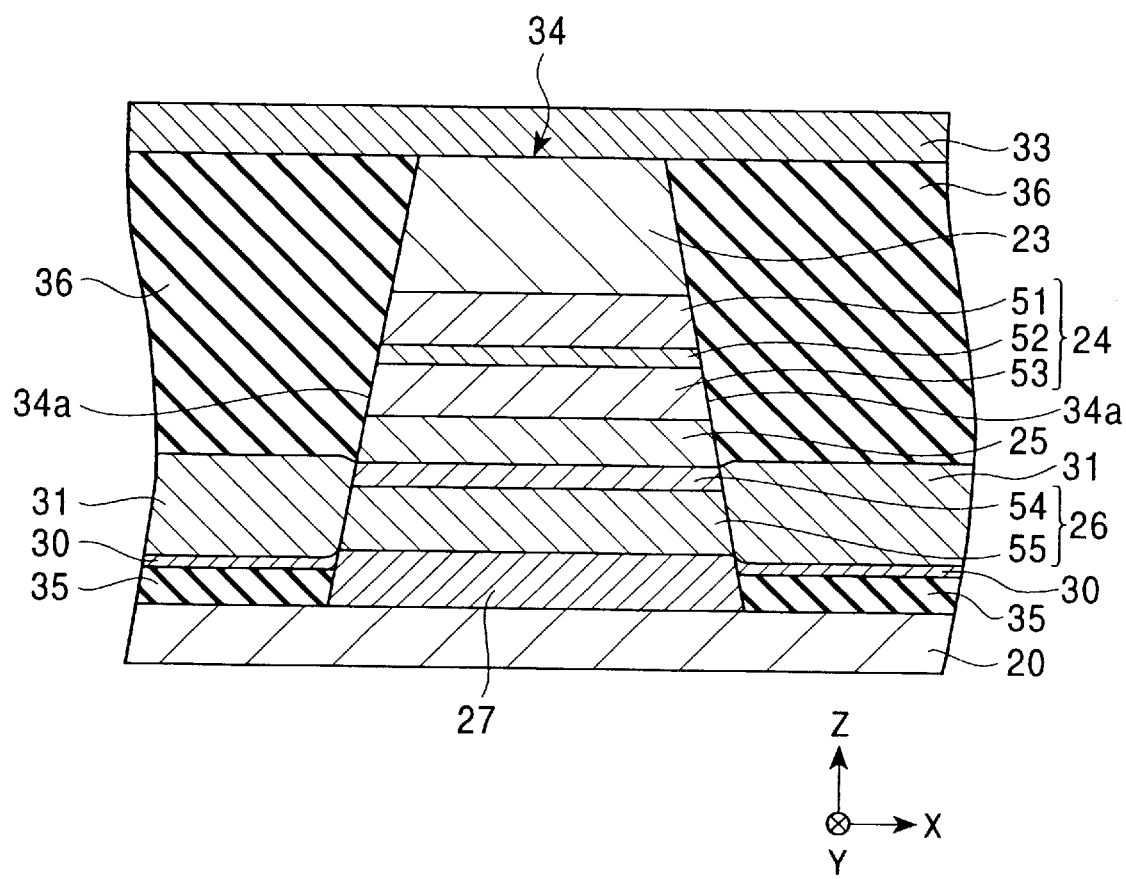
FIG. 2 is a partial sectional view of a magnetic sensing element according to a second embodiment of the present invention, as viewed from the side facing a recording medium.

FIG. 2 is a partial sectional view showing the structure of a magnetic sensing element according to a second embodiment of the present invention, as viewed from the side facing a recording medium. The layers denoted by the same reference numerals as FIG. 1 denote the same layers.

In the embodiment shown in FIG. 2, the current limiting layer 27, the free magnetic layer 26, the nonmagnetic intermediate layer 25, the pinned magnetic layer 24 and the antiferromagnetic layer 23 are laminated in turn from the bottom at the center of the upper surface of the first electrode layer 20 to form a multilayer film 34.

The multilayer film 34 has a substantially trapezoidal shape in which both side surfaces 34a thereof in the track width direction (the X direction shown in the drawing) are continuous inclined surfaces.

Furthermore, an insulating layer 35, a bias underlying layer 30, a hard bias layer 31 and an insulating layer 36 are laminated in turn from the bottom on either side of the multilayer film 34.

Also, the second electrode layer 33 is formed on the insulating layers 36 and the antiferromagnetic layer 23.

In the embodiment shown in FIG. 2, the lamination order of the multilayer film 34 is reverse to that of the multilayer film 28 of the embodiment shown in FIG. 1.

In the embodiment shown in FIG. 2, the current limiting layer 27 has a structure in which an insulating portion and a conductive portion are mixed.

Namely, in the film structure, the insulating portion of the current limiting layer 27 comprises the insulating material layer 57 having a plurality of holes 56 formed to pass through at least the current limiting layer 27, and the holes 56 are filled with the conductive material layer 58 constituting the conductive portion (refer to FIG. 7).

Alternatively, in the film structure, the conductive portion of the current limiting layer 27 comprises conductive particles dispersed in the insulating material layer constituting the insulating portion, or the insulating portion of the current limiting layer 27 comprises insulating particles dispersed in the conductive material layer constituting the conductive portion.

In this embodiment, the insulating layers 35 and 36 are formed above and below the hard bias layers 31 formed on both sides of the multilayer film 34 in the track width direction (the X direction) to prevent the sensing current flowing between the first electrode layer 20 and the second electrode layer 33 from shunting to both side regions of the multilayer film 34. Therefore, the sensing current mainly flows through the multilayer film 34 to permit an attempt to improve reproduced output.

In the embodiment shown in FIG. 2, the sensing current flows from the first electrode layer 20 to the second electrode layer 33 or in the reverse direction, and thus the current limiting layer 27 is provided directly on the current arrival surface of the free magnetic layer 26 which the sensing current reaches.

Figure 3:
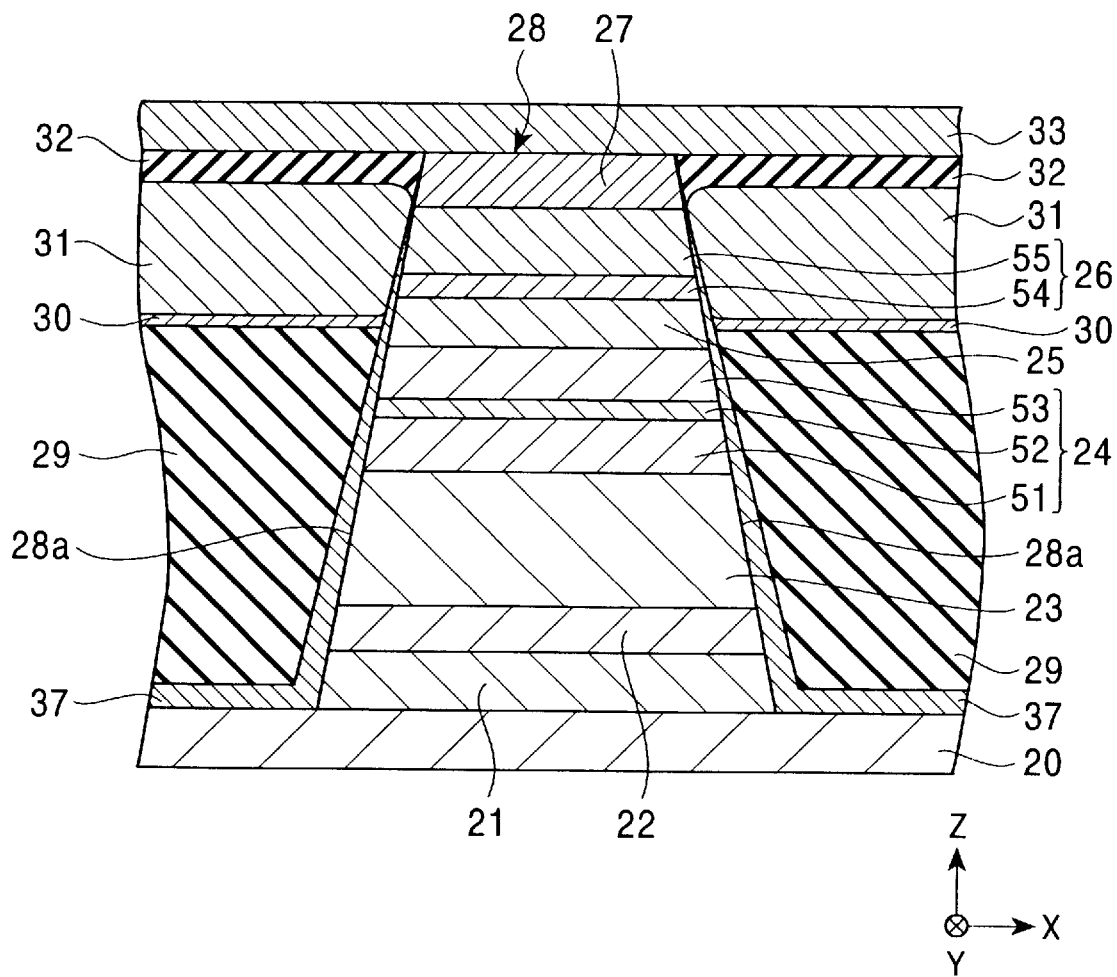
FIG. 3 is a partial sectional view of a magnetic sensing element according to a third embodiment of the present invention, as viewed from the side facing a recording medium.

FIG. 3 is a partial sectional view showing the structure of a magnetic sensing element according to a third embodiment of the present invention, as viewed from the side facing a recording medium. The layers denoted by the same reference numerals as FIG. 1 denote the same layers. The sensing current flows from the second electrode layer 33 to the first electrode layer 20 or in the reverse direction In the embodiment shown in FIG. 3, the multilayer film 28 formed between the first electrode layer 20 and the second electrode layer 33 has the same film structure as FIG. 1.

In this embodiment, specular films (also referred to as "mirror reflection films") 37 are formed to extend from the first electrode layer 20 to both side surfaces 28a of the multilayer film 28 in the track width direction (the X direction).

Each of the specular films 37 can be formed by using an oxide such as Fe—O, NiO, CoO, CoFeO, CoFeNiO, Al—O, Al—Q—O (wherein Q is at least one selected from B, Si, N, Ti, V, Cr, Mn, Fe, Co, and Ni), R—O (wherein R is at least one selected from Cu, Ti, V, Cr, Zr, Nb, Mo, Hf, Ta and W), or the like, a nitride such as Al—N, Al—Q—N (wherein Q is at least one selected from B, Si, O, Ti, V, Cr, Mn, Fe, Co, and Ni), R—N (wherein R is at least one selected from Cu, Ti, V, Cr, Zr, Nb, Mo, Hf, Ta and W), or the like, a semimetal Heuslar metal such as NiMnSb, PtMnSb, or the like.

Furthermore, the insulating layers 29, the bias underlying layers 30, the hard bias layers 31 and the insulating layer 32 are formed on the specular films 37. The second electrode layer 33 is formed on the insulating layers 32 and the current limiting layer 27.

In the embodiment show in FIG. 3, the specular films 37 are formed on both side surfaces 28a of the multilayer film 28, and even when the optical element area (Tw×MRh) of the multilayer film 28 is decreased, conduction electrons can thus be specularly reflected by the specular films 37 to suppress scattering of the conduction electrons by both side surfaces 28a. Therefore, the mean free path (spin diffusion length) of the conduction electrons can be elongated to permit an attempt to further improve the rate of change in resistance.

Figure 4:
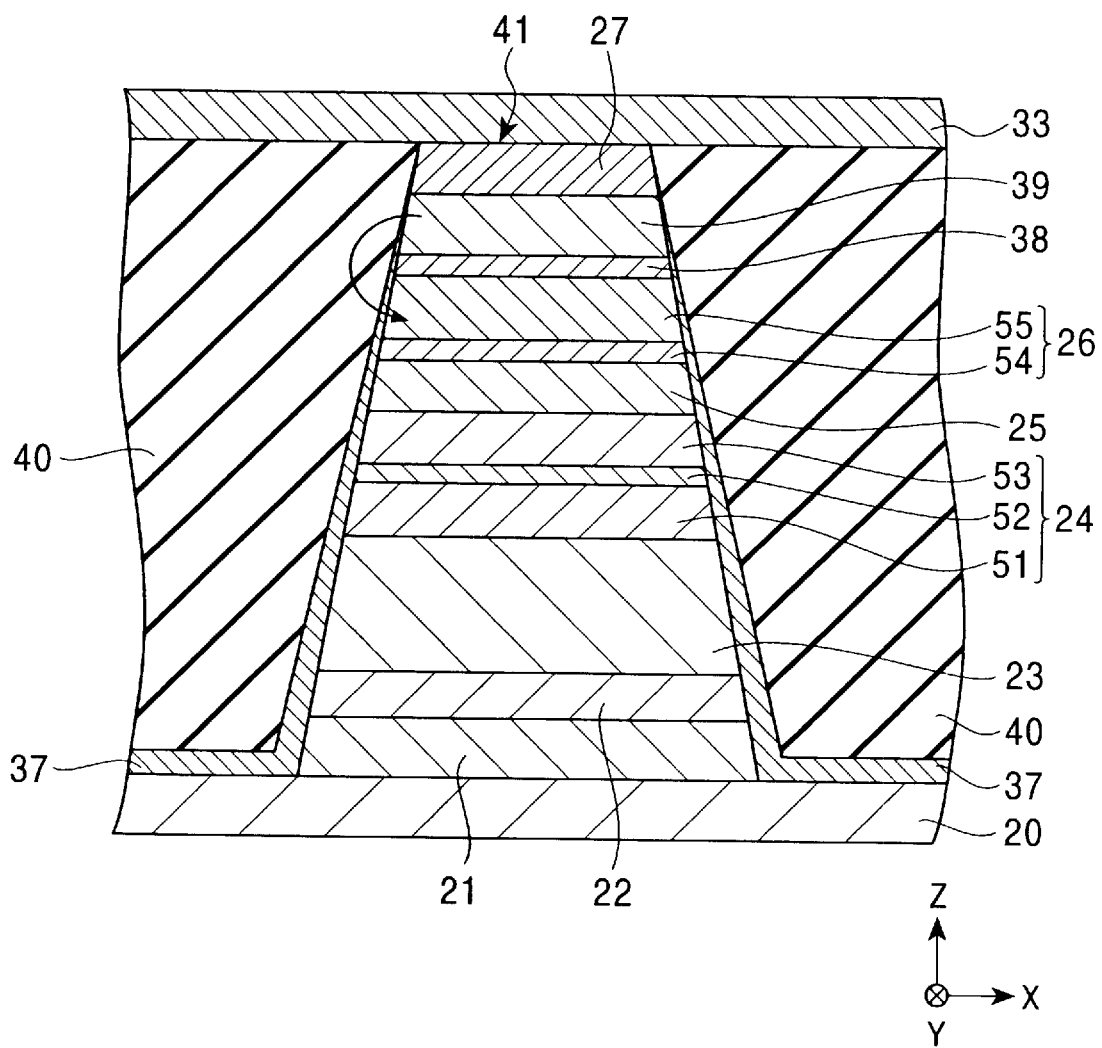
FIG. 4 is a partial sectional view of a magnetic sensing element according to a fourth embodiment of the present invention, as viewed from the side facing a recording medium.

FIG. 4 is a partial sectional view showing the structure of a magnetic sensing element according to a fourth embodiment of the present invention, as viewed from the side facing a recording medium. The layers denoted by the same reference numerals as FIG. 1 denote the same layers. The sensing current flows from the second electrode layer 33 to the first electrode layer 20 or in the reverse direction In the embodiment shown in FIG. 4, a hard bias layer 39 is provided on the free magnetic layer 26 with an intermediate layer 38 provided therebetween, and the current limiting layer 27 is provided on the hard bias layer 39.

In this embodiment, a longitudinal bias magnetic field is applied (as shown by an arrow in FIG. 4) to the free magnetic layer 26 from both side ends of the hard bias layers 39 formed on the free magnetic layer 26 with the intermediate layer 38 provided therebetween, thereby orienting magnetization of the free magnetic layer 26 in the X direction shown in the drawing.

The intermediate layer 38 is preferably made of a non-magnetic conductive material. Specifically, the intermediate layer is preferably made of an alloy of at least one of Ru, Rh, Ir, Cr, Re and Cu. In the present invention, the intermediate layer 38 can also be used as the current limiting layer. The intermediate layer 38 may be made of an insulating material, for example, $Al_2O_3$ or $SiO_2$. In this case, however, the intermediate layer 38 must be formed in a small thickness so as to prevent the sensing current flowing between the first electrode layer 20 and the second electrode layer 33 from being cut off by the intermediate layer 38. The thickness of the intermediate layer 38 is preferably 20 to 100 Å.

Like in this embodiment, the current limiting layer 27 may be provided on the free magnetic layer 26 through another layer, not provided directly on the arrival surface side (upper side) of the free magnetic layer 26 which the sensing current reaches.

The current limiting layer 27 may be formed between the free magnetic layer 26 and the intermediate layer 38 so as to be formed directly on the arrival surface side (upper side) of the free magnetic layer 26 which the sensing current reaches.

Like in the embodiment shown in FIG. 2, when the free magnetic layer 26 is formed below the antiferromagnetic layer 23, the current limiting layer 27, the hard bias layer 39, the intermediate layer 38 and the free magnetic layer 26 are laminated in turn on the first electrode layer. In this case, the lower side of the free magnetic layer 26 is the arrival side which the sensing current reaches. The sensing current may flow from the second electrode layer 33 to the first electrode layer 20.

In the structure in which the hard bias layer 39 is provided on the free magnetic layer 26 with the intermediate layer 38 provided therebetween, as shown in FIG. 4, the free magnetic layer 26 is not strongly magnetized to permit proper domain control of the free magnetic layer 26, as compared with a case in which the hard bias layers are provided on both sides of the free magnetic layer 26. Therefore, a change in magnetization of the free magnetic layer 26 with an external magnetic field can be improved.

In the embodiment shown in FIG. 4, only insulating layers 40 are formed on both sides of a multilayer film 41 in the track width direction (the X direction), which ranges from the underlying layer 21 to the current limiting layer 27.

Therefore, in the embodiment shown in FIG. 4, the sensing current flowing between the first electrode layer 20 and the second electrode layer 33 effectively flows only through the multilayer film 41 to permit a decrease in shunt loss of the sensing current.

Figure 5:
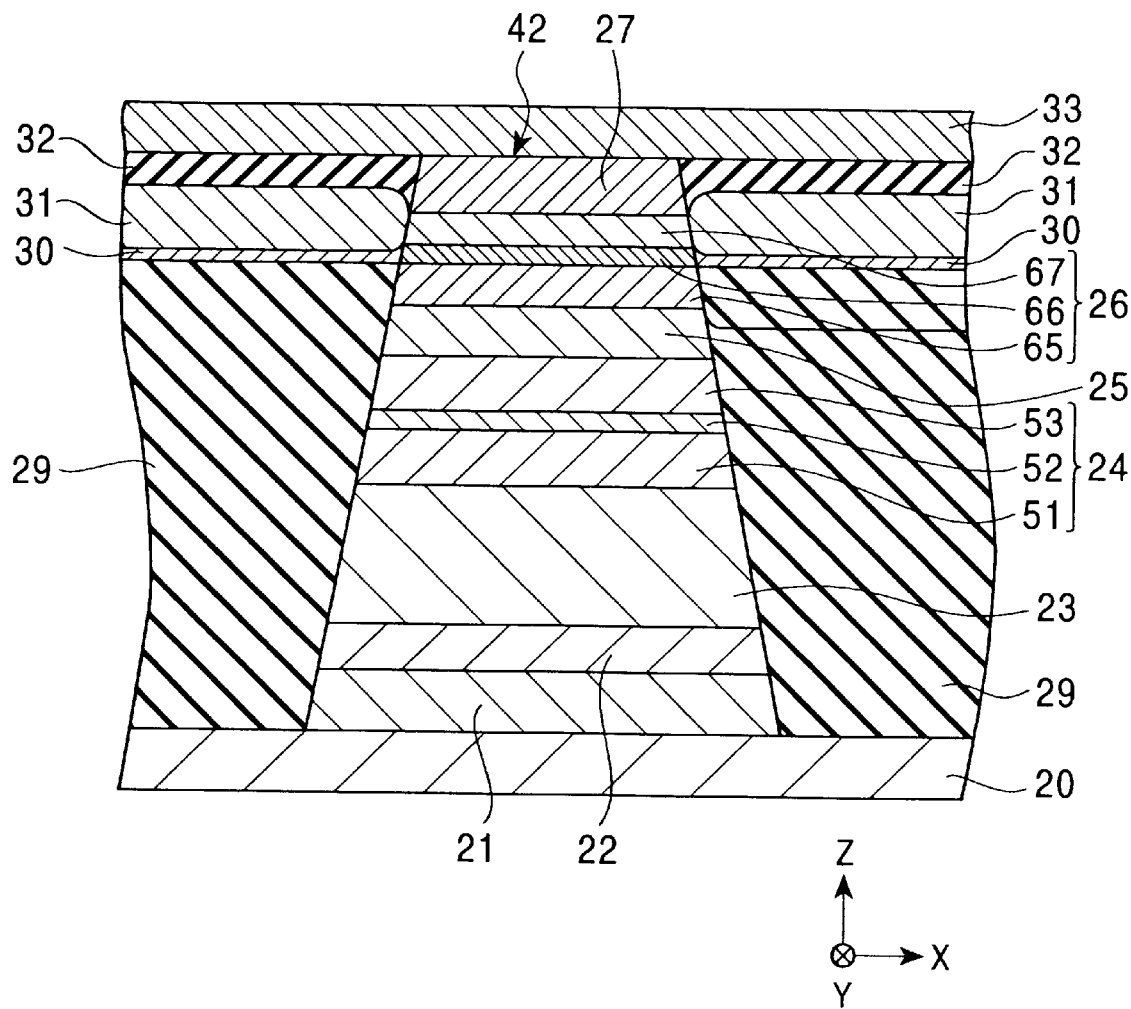
FIG. 5 is a partial sectional view of a magnetic sensing element according to a fifth embodiment of the present invention, as viewed from the side facing a recording medium.

FIG. 5 is a partial sectional view showing the structure of a magnetic sensing element according to a fifth embodiment of the present invention, as viewed from the side facing a recording medium.

In the embodiment shown in FIG. 5, the free magnetic layer 26 has a three-layer ferrimagnetic structure.

The free magnetic layer 26 comprises magnetic layers 65 and 67 which are made of, for example, Co, CoFe, NiFe, CoFeNi, or the like, and an intermediate layer 66 made of Ru or the like and formed between the magnetic layers 65 and 67. In this structure, the magnetization directions of the magnetic layers 65 and 67 are antiparallel to each other due to RKKY interaction. This is referred to as a so-called "synthetic ferrimagnetic state".

The thickness of each of the magnetic layers 65 and 67 is about 10 Å to 70 Å, and the thickness of the intermediate layer 66 is about 3 Å to 10 Å.

The materials and thicknesses of the magnetic layers 65 and 67 are different so that both magnetic layers 65 and 67 have different magnetic moments per unit area. The magnetic moment is set by saturation magnetization Ms×thickness t, and for example, when the magnetic layers 65 and 67 are made of the same material having the same composition, the magnetic layers 65 and 67 have different thicknesses so that both magnetic layers 65 and 67 have different magnetic moments. This can appropriately form the magnetic layers 65 and 67 in a synthetic ferrimagnetic structure.

As shown in FIG. 5, by forming the free magnetic layer 26 having the synthetic ferrimagnetic structure, the free magnetic layer 26 can be properly put into a single magnetic domain state, thereby permitting the manufacture of a magnetic sensing element having high reproduced output and causing no Barkhausen noise. Of the magnetic layers 65 and 67, the magnetic layer 65 in contact with the nonmagnetic intermediate layer 25 is concerned in the magnetoresistive effect As shown in FIG. 5, the insulating layers 29 are formed on both sides of the multilayer film 42 in the track width direction (the X direction), which ranges from the underlying layer 21 to the current limiting layer 27. However, the upper surfaces of the insulating layers 29 may be located at substantially the same position as the upper surface of the intermediate layer 66 of the free magnetic layer 26. Namely, the hard bias layers 31 formed on the insulating layers 29 through the bias layers 30 may be connected only to both sides of the magnetic layer 67 which constitutes the free magnetic layer 26.

When the magnetic layer 67 is magnetized in the X direction shown in the drawing by a longitudinal bias magnetic field from the hard bias layers 31, the magnetic layer 65 is magnetized in antiparallel to the magnetization direction of the magnetic layer 67 due to RKKY interaction between the magnetic layers 65 and 67.

The free magnetic layer 26 having the three-layer ferrimagnetic structure shown in FIG. 5 can be applied to each of the embodiments shown in FIGS. 2, 3 and 4.

Also, the structure in which the specular films 37 are formed on both sides of the multilayer film as shown in FIG. 3, and the structure in which the hard bias layer 39 is formed, through the intermediate layer 38, on the side of the free magnetic layer 26 which is opposite to the side in contact with the nonmagnetic intermediate layer 25, as shown in FIG. 4 can be applied to the embodiment shown in FIG. 5.

Figure 6:
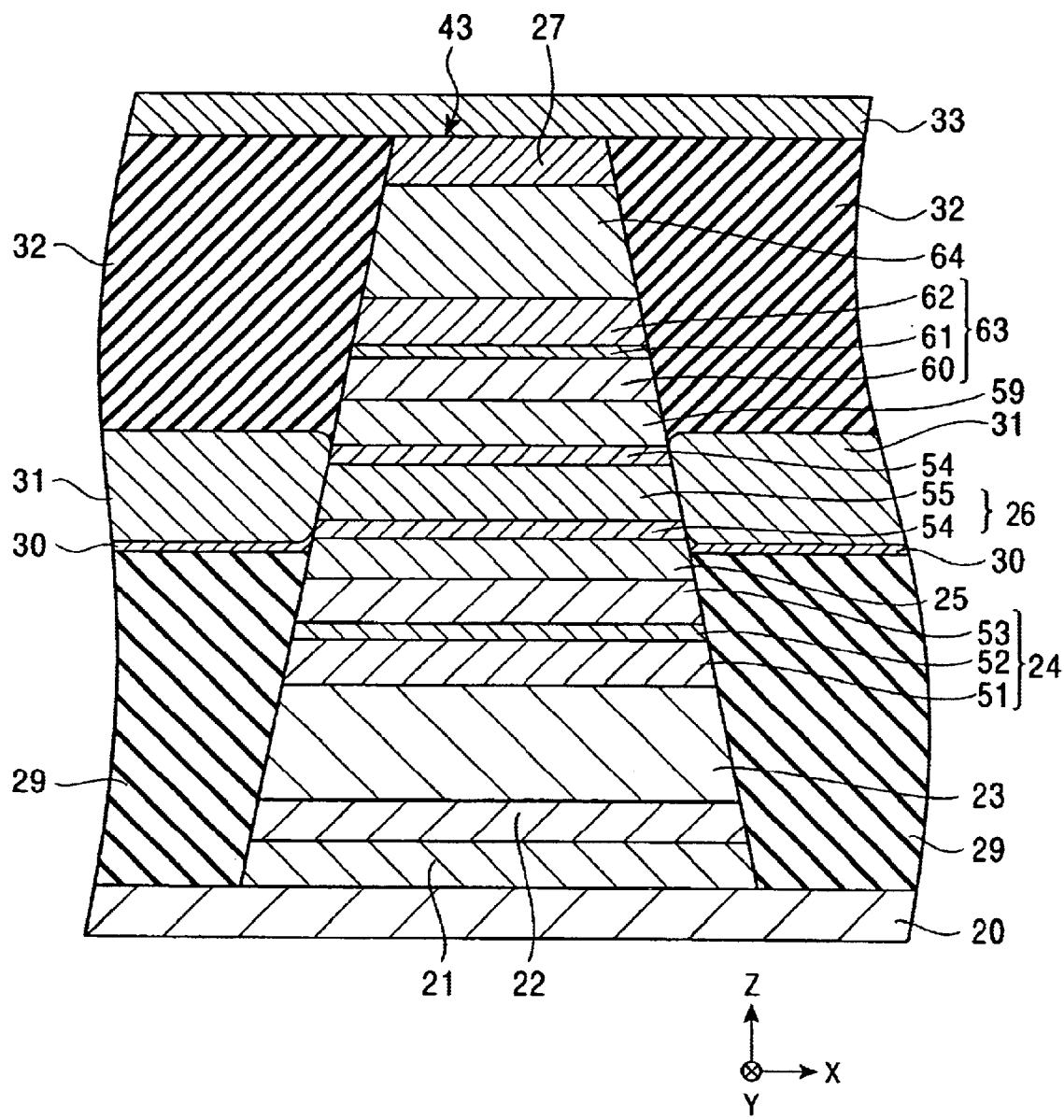
FIG. 6 is a partial sectional view of a magnetic sensing element according to a sixth embodiment of the present invention, as viewed from the side facing a recording medium.

FIG. 6 is a partial sectional view showing the structure of a magnetic sensing element according to a sixth embodiment of the present invention, as viewed from the side facing a recording medium.

The magnetic sensing element shown in FIG. 6 is a so-called dual type spin-valve thin film element. The layers denoted by the same reference numerals as FIG. 1 denote the same layers.

In this embodiment, the underlying layer 21, a seed layer 22, the antiferromagnetic layer 23, the pinned magnetic layer 24 having a three-layer ferrimagnetic structure, the nonmagnetic intermediate layer 25 and the free magnetic layer 26 are formed at the center of the upper surface of the first electrode layer 20 to form the same laminated structure as shown in FIG. 1.

In this embodiment, furthermore, a Co film 54 is formed on the free magnetic layer 26, and a nonmagnetic intermediate layer 59, a pinned magnetic layer 63 having a three-layer ferrimagnetic structure comprising magnetic layers 60 and 62 and an intermediate layer 61 of Ru formed between the magnetic layers 60 and 62, an antiferromagnetic layer 64 and the current limiting layer 27 are laminated in turn on the Co film 54.

In the dual spin-valve thin film element having the structure shown in FIG. 6, when the magnetic layer 53 of the pinned magnetic layer 24 formed below the free magnetic layer 26 and concerned in the magnetoresistive effect is pinned, for example, in the height direction (the Y direction shown in the drawing), the magnetic layer 60 of the pinned magnetic layer 63 formed above the free magnetic layer 26, which is concerned in the magnetoresistive effect, is also pinned in the height direction (the Y direction).

In this embodiment, the free magnetic layer 26 may have the three-layer ferrimagnetic structure shown in FIG. 5. In this case, when the magnetic layer 53 of the pinned magnetic layer 24 formed below the free magnetic layer 26 and concerned in the magnetoresistive effect is magnetized in the Y direction shown in the drawing, the magnetic layer 60 of the pinned magnetic layer 63 formed above the free magnetic layer 26, which is concerned in the magnetoresistive effect, is magnetized in the direction opposite to the Y direction.

As shown in FIG. 6, the insulating layer 29, the bias underlying layers 30, the hard bias layers 31 and the insulating layer 32 are laminated in turn on both sides of a multilayer film 43 in the track width direction (the X direction), which ranges from the underlying layer 21 to the current limiting layer 27.

In this embodiment, the specular films 37 may be formed, as shown in FIG. 3.

In this embodiment, the sensing current flows from the second electrode layer 33 to the first electrode layer 20 or in the reverse direction, and thus the upper surface of the free magnetic layer 26 is the arrival side which the sensing current reaches. Although the current limiting layer 27 is formed on the antiferromagnetic layer 64 formed above the free magnetic layer 26, the current limiting layer 27 may be formed between the free magnetic layer 26 and the nonmagnetic intermediate layer 59 so as to be provided directly on the arrival surface (upper side) of the free magnetic layer 26 which the sensing current reaches.

In each of the embodiments shown in FIGS. 2 to 6, like in FIG. 1, by providing the current limiting layer 27 in which the insulating portion and the conductive portion are mixed on the free magnetic layer 26, the effect below can be expected.

Namely, like in the present invention, in a CPP type magnetic sensing element, the sensing current flowing from the second electrode layer 33 to the first electrode layer 20 (in FIG. 2, the sensing current flowing from the first electrode layer 20 to the second electrode layer 33) flows through the current limiting layer 27 perpendicularly to the film plane. However, in the present invention, the current limiting layer 27 has the structure in which the holes 56 formed in the insulating material layer (the insulating portion) 57 is filled with the conductive material layer (the conductive portion) 58, and thus the sensing current flows only through the conductive material layer 58.

Therefore, the sensing current flowing to the free magnetic layer 26 from the second electrode layer 33 through the current limiting layer 27 locally flows only to the portion of the free magnetic layer 26, which corresponds to the conductive material layer 58 to locally increase the current density of this portion.

Therefore, in the present invention, even when the element area (referred to as the "optical element area") of the free magnetic layer 26 in the direction parallel to the film plane is formed in the same large size as a conventional element, the element area (referred to as the "effective element area") in which the sensing current actually flows through the free magnetic layer 26 to be concerned in the magnetoresistive effect can be decreased. Therefore, even when the magnetic sensing element is formed in a large optical element size by using the photolithography technique having the same degree of accuracy as a conventional technique, a CPP type magnetic sensing element having high reproduced output can easily be formed.

Also, in the present invention, the optical element area is substantially the same as a conventional element, and thus the magnetic sensing element can effectively sense an external magnetic field from the recording medium, permitting the manufacture of a CPP type magnetic sensing element having high sensitivity and excellent reproducing characteristics.

In the embodiments shown in FIGS. 1 to 6, the current limiting layer 27 is formed on the arrival side of the free magnetic layer 26 which the sensing current reaches. However, the current limiting layer 27 may be provided, directly or through another layer, on the side of the free magnetic layer opposite to the arrival side which the sensing current reaches. However, the current limiting layer 27 is preferably provided on the side near the portion with T2 (refer to FIG. 1), which substantially produces the magnetoresistive effect, because the current path of the sensing current can be appropriately narrowed. As a result, the effective element area can be decreased to permit the manufacture of a CPP type magnetic sensing element having high reproduced output.

The current limiting layer 27 may be provided above and below the free magnetic layer directly or through other layers.

Figure 9:
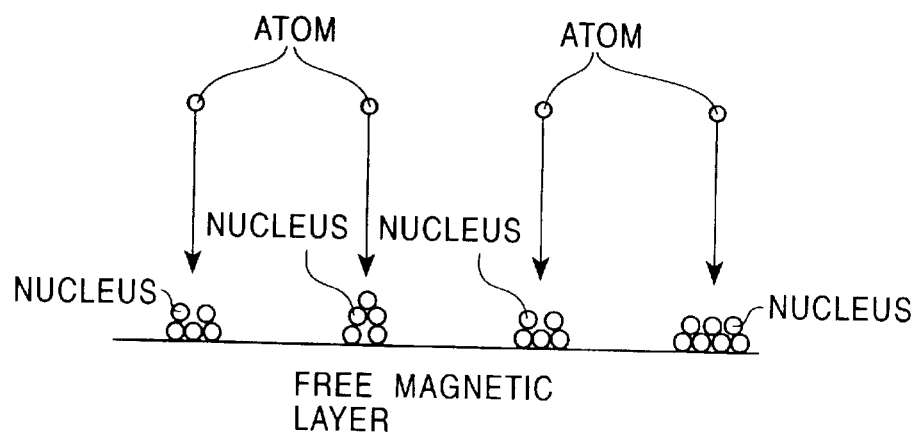
FIG. 9 is a schematic drawing showing the state of a free magnetic layer in formation of a current limiting layer on the free magnetic layer.
Figure 10:
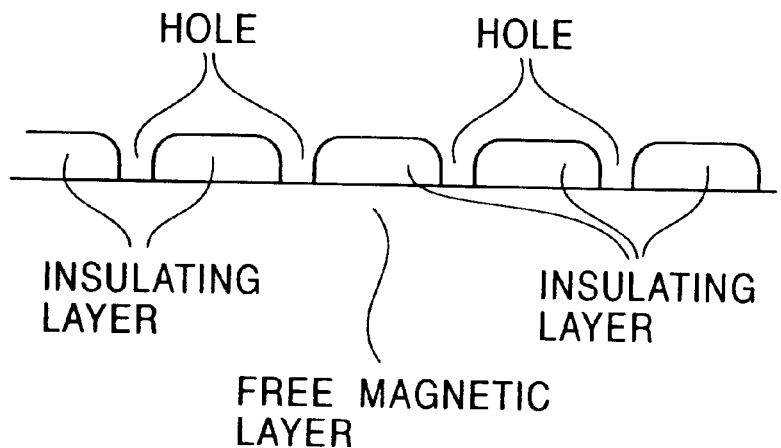
FIG. 10 is a partial schematic drawing showing a state after the state shown in FIG. 9.
Figure 11:
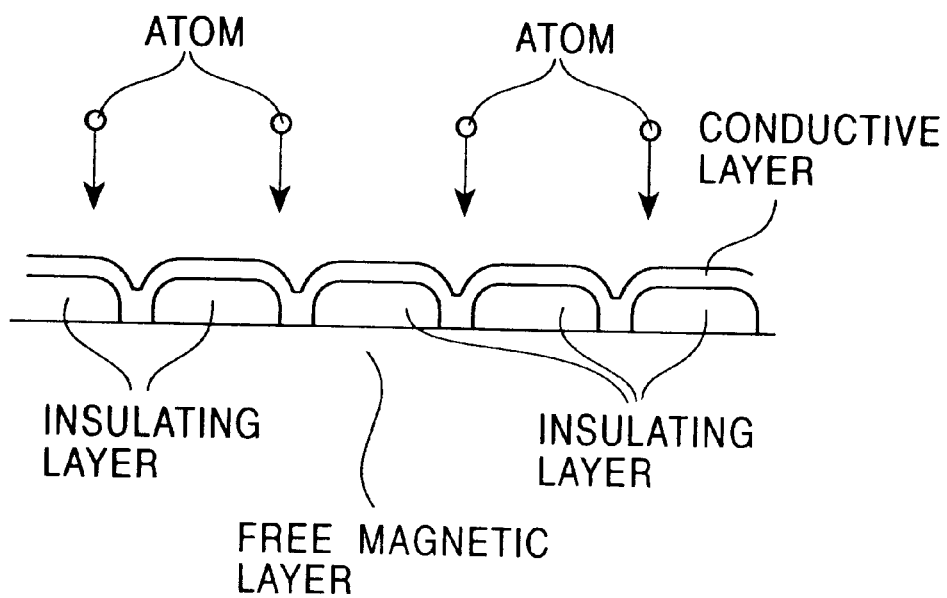
FIG. 11 is a partial schematic drawing showing a state after the state shown in FIG. 10.

A description will now be made of the method of manufacturing the magnetic sensing element shown in FIG. 1 with reference to the manufacturing steps shown in FIGS. 8 to 12. FIGS. 8 to 12 are partial sectional views each showing the magnetic sensing element being manufactured, as viewed from the side facing the recording medium. FIGS. 9 to 11 are partial sectional views each showing the state of the upper surface of the free magnetic layer during deposition of the current limiting layer on the free magnetic layer by sputtering.

Figure 8:
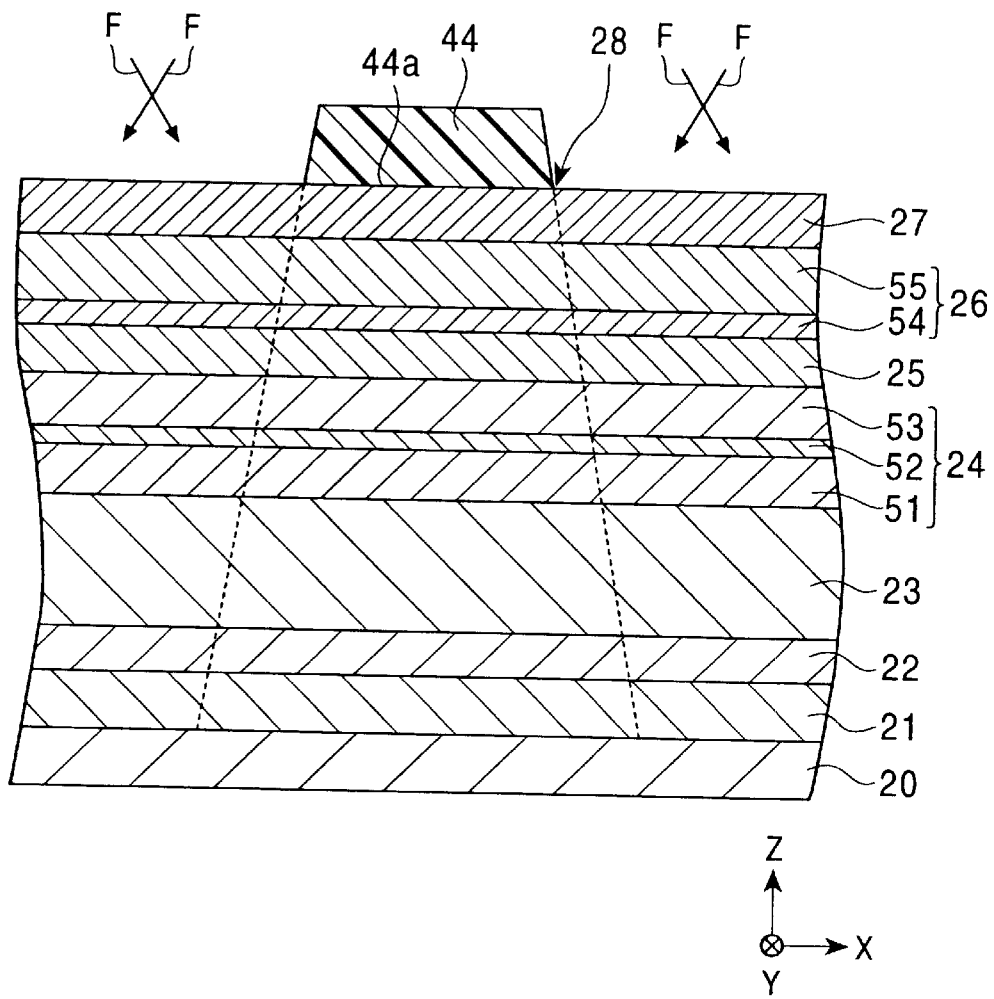
FIG. 8 is a drawing showing a step of a method of manufacturing the thin film magnetic head shown in FIG. 1.

In the step shown in FIG. 8, the underlying layer 21 made of Ta or the like, the seed layer 22 made of NiFeCr or the like, the antiferromagnetic layer 23 made of PtMn or the like, the pinned magnetic layer 24 having the three-layer ferrimagnetic structure comprising the magnetic layers 51 and 53 made of Co or the like and the intermediate layer 51 made of Ru or the like, the nonmagnetic intermediate layer 24 made of Cu or the like, the free magnetic layer 26 comprising the Co film 54 and the magnetic layer 55 made of NiFe or the like, and the current limiting layer 27 in which the insulating portion and the conductive portion are mixed are laminated in turn on the first electrode layer 20.

The method of producing the current limiting layer 27 is described with reference to FIGS. 9 to 11.

In order to form the current limiting layer 27, an oxide film of $Al_2O_3$, $SiO_2$, or the like, or a nitride film of AlN or the like is first deposited on the free magnetic layer 26 by sputtering. In the present invention, as the oxide film, an insulating material composed of an oxide of at least one of Al, Si, Ti, Zr, Hf, Cr, Ta, V, Nb, Mo, W, Fe, Ni and Co is preferably used.

As the nitride film, an insulating material composed of a nitride of at least one of Al, Si, Ti, Zr, Hf, Cr, Ta, V, Nb, Mo, W, Fe, Ni and Co is preferably used.

The oxide film and nitride film are insulating materials which are not easily made continuous, i.e., which are easily made discontinuous, on the free magnetic layer 26 depending upon the deposition conditions. This property of being easily made discontinuous means that particles of the insulating material are easily agglomerated on the free magnetic layer 26 to easily form nuclei.

In order to improve the agglomeration property, it is important to appropriately control the sputtering conditions for sputtering deposition of the insulating material.

First, the substrate temperature is set to a low temperature of 20 to 200° C. The substrate-to-target distance is set to about 200 to 300 mm. The Ar gas pressure is increased to about 10 to 50 mTorr (1.3 to 6.7 Pa).

Under the above sputtering conditions, the atoms of the insulating material are aggregated on the free magnetic layer 26 due to insufficient movement on the surface to easily form nuclei.

FIG. 10 shows the state in which the nuclei are grown. In this way, a plurality of holes are formed in the insulating material layer formed on the free magnetic layer 26 so as to pass through the insulating material layer.

In the next step shown in FIG. 11, the conductive material is deposited on the insulating material layer and in the holes by sputtering. As a result, the conductive material layer is formed on the insulating material layer and in the holes to create the state in which the holes are filled with the conductive material layer.

As the conductive material, α-Ta, Au, Cr, Cu (copper), W (tungsten) or the like can be used. The sputtering conditions of the conductive material include a substrate temperature of about 20 to 100° C., a substrate-to-target distance of about 40 to 100 mm, and an Ar gas pressure of about 0.5 to 10 mTorr (0.07 to 1.3 Pa).

The current limiting layer 27 can be formed by the above-described production method.

Alternatively, in the present invention, a target comprising the insulating material, and a target comprising the conductive material are prepared, and two targets are sputtered to form the current limiting layer 27, on the free magnetic layer 26, in which particles of the insulating material and the conductive material are mixed. In the present invention, although the above-described materials may be used as the insulating material and the conductive material, the materials described below may be used for forming the current limiting layer 27 having a film structure in which conductive particles are dispersed in an insulating material layer.

Specifically, in the present invention, the current limiting layer 27 is deposited by sputtering on the upper surface of the free magnetic layer 26 by using a material having a composition represented by the formula $Fe_aM_bO_c$ (wherein M is at least one element selected from Ti, Zr, Hf, Nb, Ta, Mo, W, and the rare earth elements), wherein the composition ratios a, b and c by atomic % are $40 \leq a \leq 50$, $10 \leq b \leq 30$ and $20 \leq c \leq 40$, respectively, and satisfy the relationship a+b+c=100, to form a film structure in which microcrystal grains composed of Fe as a main component are dispersed in an amorphous material containing an O compound of element M.

Alternatively, the current limiting layer 27 may be deposited by sputtering on the upper surface of the free magnetic layer 26 by using a material having a composition represented by the formula $Fe_dM_eO_f$ (wherein M is at least one element selected from Ti, Zr, Hf, Nb, Ta, Mo, W, and the rare earth elements), wherein the composition ratios d, e and f by atomic % are $60 \leq d \leq 70$, $10 \leq e \leq 15$ and $19 \leq f \leq 25$, respectively, and satisfy the relationship d+e+f=100, to form a film structure in which microcrystal grains composed of Fe as a main component are dispersed in an amorphous material containing an N compound of element M.

In order to deposit a FeMO or FeMN alloy, for example, a Fe target and a target comprising MO or MN are prepared, and sputtered to form the current limiting layer 27 having the above-described composition ratios and film structure.

In the step shown in FIG. 8, a resist layer 44 is formed on the current limiting layer 27. The resist layer 44 may be a lift-off resist layer.

The lower surface 44a of the resist layer 44 is substantially the same as or slightly smaller than the optical element area of the magnetic sensing element. In the present invention, the track width Tw determined by the width dimension of the upper surface of the free magnetic layer 26 in the track width direction (the X direction shown in the drawing) can be set to 0.15 to 0.3 μm, and the length MRh in the height direction (the Y direction) can be set to 0.15 to 0.3 μm. Therefore, the optical element area can be increased to 0.02 to 0.09 μm².

The above optical element area is substantially the same as a conventional element, and thus a magnetic sensing element can be manufactured by the photolithography technique having the same degree of accuracy as a conventional technique.

Then, as shown in FIG. 8, the portion of the multilayer film 28 ranging from the underlying layer 21 to the current limiting layer 27, which is not covered with the resist layer 44, is removed by ion milling or the like from the direction of arrow F (the portion shown by dotted lines in FIG. 8). As a result, the multilayer film 28 having a substantially trapezoidal shape and ranging from the underlying 21 to the current limiting layer 27 is left at the center of the upper surface of the first electrode layer 20. Since the materials removed by ion milling partially re-adhere to both side surfaces of the multilayer film 28 after ion milling, the re-adhering materials are preferably removed by side milling.

Figure 12:
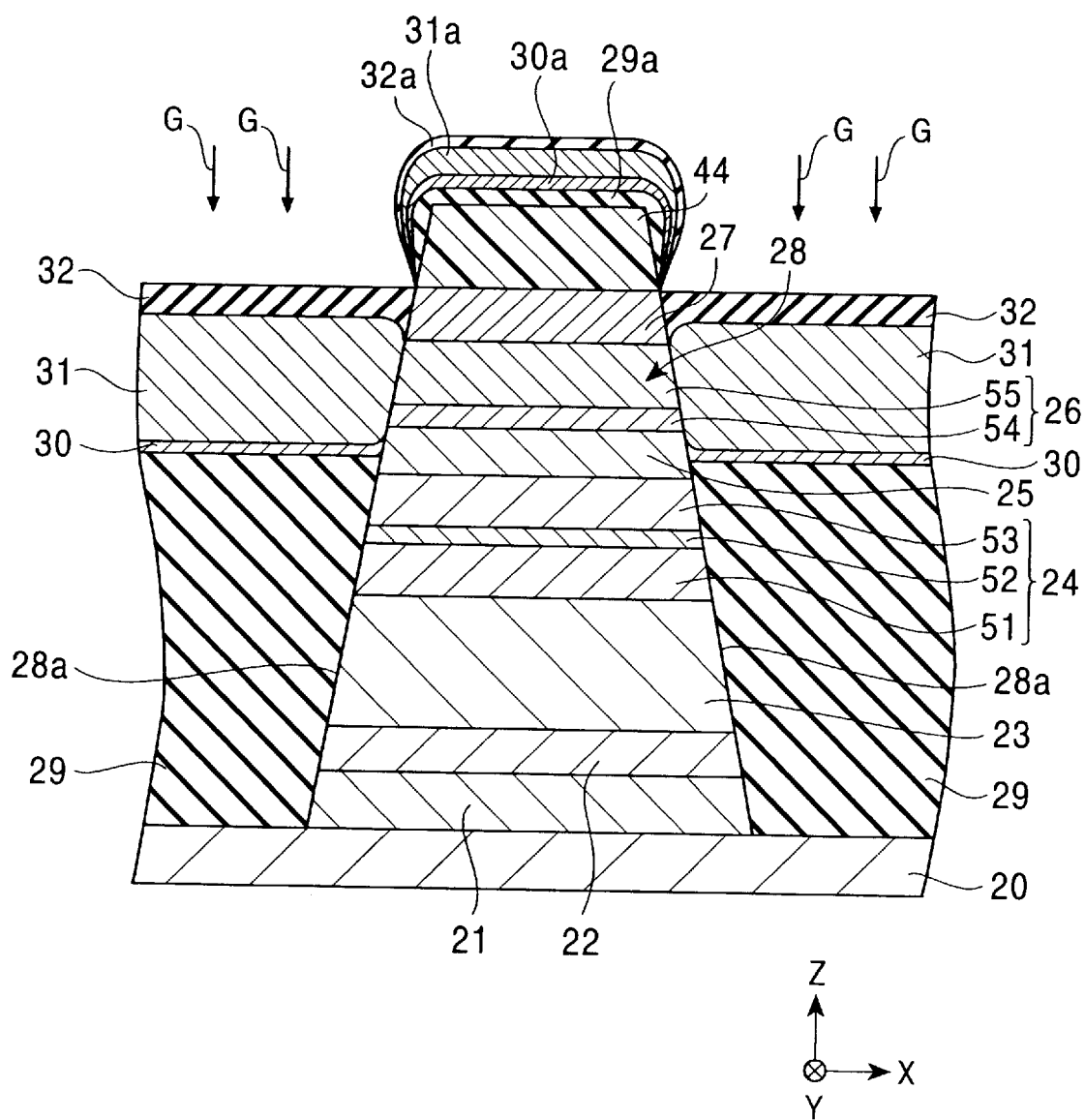
FIG. 12 is a drawing showing a step after the step shown in FIG. 8.
Figure 13:
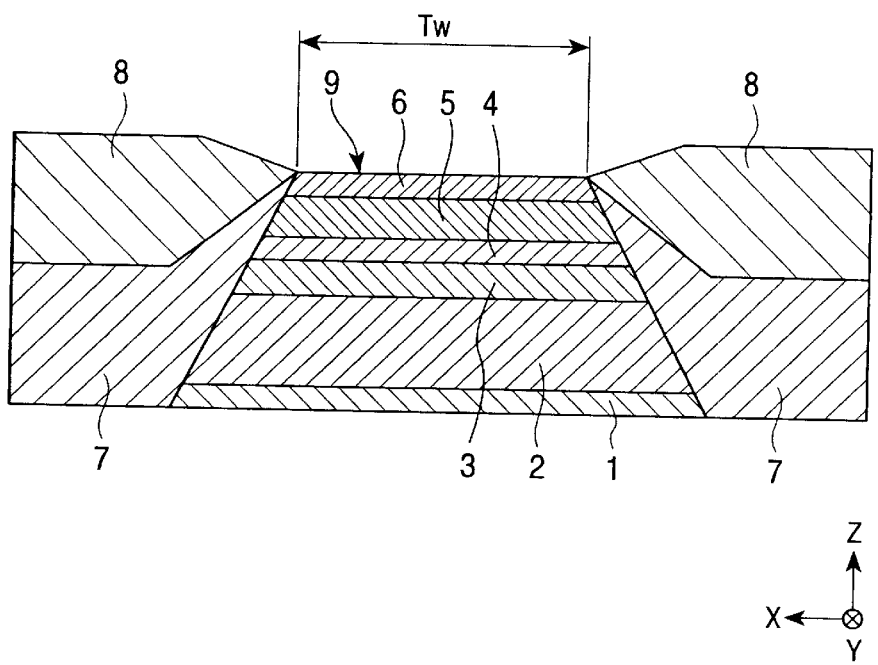
FIG. 13 is a partial sectional view of a conventional magnetic sensing element, as viewed from the side facing a recording medium.
Figure 14:
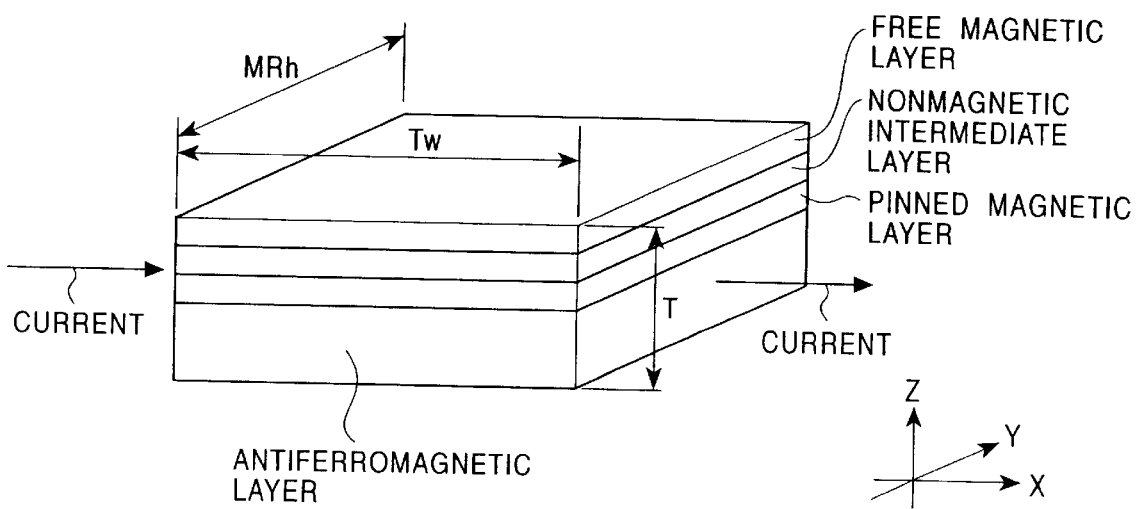
FIG. 14 is a partial schematic drawing of a CIP type magnetic sensing element.
Figure 15:
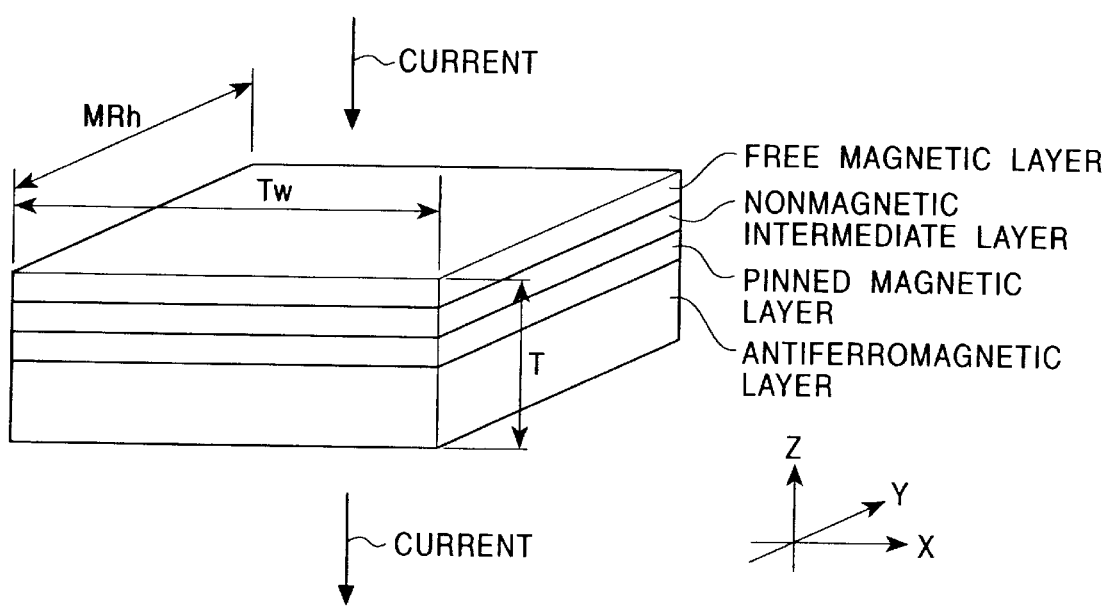
FIG. 15 is a partial schematic drawing of a CPP type magnetic sensing element.

In the next step shown in FIG. 12, the insulating layers 29 made of $Al_2O_3$ or the like, the bias underlying layers 30 made of Cr or the like, the hard bias layers 31 made of CoPtCr or the like, and the insulating layers 32 made of $Al_2O_3$ or the like are deposited by sputtering on the first electrode layer 20 to be located on both sides of the multilayer film 28.

As shown in FIG. 12, in sputtering deposition of each of the layers ranging from the insulating layers 29 to the insulating layers 32, the irradiation direction of sputtered particles is preferably direction G substantially perpendicular to the substrate.

As shown in FIG. 12, an insulating layer 29a, a bias underlying material layer 30a, a bias material layer 31a, and an insulating material layer 32a are also deposited on the resist layer 44.

After each of the layers ranging from the insulating layers 29 to the insulating layers 32 is laminated on both sides of the multilayer film 28, the resist layer 44 is removed. However, when the entire surface of the resist layer 44 is covered with the insulating layer 29a, etc., the resist layer 44 cannot be properly removed. A conceivable removal method is, for example, a scrub cleaning method in which the insulating layer 29a, etc, which cover the surface of the resist layer 44, are partially removed by collision of dry ice particles with each of the layers to partially expose the surface of the resist layer 44, and then the resist layer 44 is immersed in a solvent to dissolve the resist layer 44.

In some cases, unnecessary burrs of the insulating layer 29a, etc. remain on the upper surfaces of the insulating layers 32 and the current limiting layer 27 after the resist layer 44 is removed. Therefore, the burrs are preferably removed from the upper surfaces of the insulating layers 32 and the current limiting layer 27, for example, by scrub leaning to form clean surfaces. A conceivable scrub cleaning method is, for example a method of causing dry ice particles to collide with the burrs.

Then, the second electrode layer 33 is deposited on the insulating material layers 32 and the current limiting layer 27 by sputtering (refer to FIG. 1).

The methods of manufacturing the other magnetic sensing elements are described in brief below. In the method of manufacturing the magnetic sensing element shown in FIG. 2, the current limiting layer 27, the free magnetic layer 26, the nonmagnetic intermediate layer 25, the pinned magnetic layer 24, and the antiferromagnetic layer 23 are deposited on the first electrode layer 20 by sputtering, and then the resist layer 44 is formed on the antiferromagnetic layer 23 in the same manner as the step shown in FIG. 8. Then, the portion of the multilayer film 34, which is not covered with the resist layer 44, is removed by ion milling. Next, the insulating layers 35, the bias underlying layers 30, the hard bias layers 31, and the insulating layers 36, are deposited by sputtering on the first electrode layer 20 to be located on both sides of the multilayer film 34, and then the resist layer 44 is removed. Then, the second electrode layer 33 is formed on the insulating layers 36 and the antiferromagnetic layer 23.

In the method of manufacturing the magnetic sensing element shown in FIG. 3, the underlying layer 21, the seed layer 22, the antiferromagnetic layer 23, the pinned magnetic layer 24, the nonmagnetic intermediate layer 25, the free magnetic layer 26, and the current limiting layer 27 are deposited on the first electrode layer 20 by sputtering, and then the resist layer 44 is formed on the current limiting layer 27 in the same manner as the step shown in FIG. 8. Then, the portion of the multilayer film 28, which is not covered with the resist layer 44, is removed by ion milling. Next, the materials re-adhering to both side surfaces 28a of the multilayer film 28 in ion milling are removed by side milling.

Next, the specular films 37 are deposited by sputtering to extend from the first electrode layer 20 to both side surfaces 28a of the multilayer film 28. Sputtering deposition of the specular films 37 is performed obliquely to the substrate. During the sputtering, the irradiation angle of sputtered particles is preferably about 20° to 70° relative to the direction perpendicular to the substrate surface.

Then, the insulating layers 29, the bias underlying layers 30, the hard bias layers 31, and the insulating layers 32 are deposited by sputtering on the specular films 37, and then the resist layer 44 is removed. Then, the second electrode layer 33 is formed on the insulating layers 36 and the current limiting layer 27.

In the method of manufacturing the magnetic sensing element shown in FIG. 4, the underlying layer 21, the seed layer 22, the antiferromagnetic layer 23, the pinned magnetic layer 24, the nonmagnetic intermediate layer 25, the free magnetic layer 26, the intermediate layer 38, the hard bias layer 39, and the current limiting layer 27 are continuously deposited on the first electrode layer 20 by sputtering, and then the portion of the multilayer film 41, which is not covered with the resist layer 44, is removed by ion milling in the same manner as the step shown in FIG. 8. Next, the materials re-adhering to both side surfaces 41a of the multilayer film 41 in ion milling are removed by side milling.

Next, the specular films 37 are deposited by sputtering to extend from the first electrode layer 20 to both side surfaces 41a of the multilayer film 41. Sputtering deposition of the specular films 37 is performed obliquely to the substrate. During the sputtering, the irradiation angle of sputtered particles is preferably about 20° to 70° relative to the direction perpendicular to the substrate surface.

Then, the insulating material layers 40 are deposited by sputtering on the specular films 37, and then the resist layer 44 is removed. Then, the second electrode layer 33 is formed on the insulating material layers 40 and the current limiting layer 27.

In the method of manufacturing the magnetic sensing element shown in FIG. 5, the underlying layer 21, the seed layer 22, the antiferromagnetic layer 23, the pinned magnetic layer 24, the nonmagnetic intermediate layer 25, the free magnetic layer 26 having a three-layer ferrimagnetic structure, and the current limiting layer 27 are continuously deposited on the first electrode layer 20 by sputtering, and then the portion of the multilayer film 42, which is not covered with the resist layer 44, is removed by ion milling in the same manner as the step shown in FIG. 8.

Then, the insulating layers 29, the bias underlying layers 30, the hard bias layers 31 and the insulating layers 32 are continuously deposited by sputtering on the first electrode layer 20 to be located on both sides of the multilayer film 42, and then the resist layer 44 is removed. Then, the second electrode layer 33 is formed on the insulating layers 32 and the current limiting layer 27.

In the method of manufacturing the magnetic sensing element shown in FIG. 6, the underlying layer 21, the seed layer 22, the antiferromagnetic layer 23, the pinned magnetic layer 24, the nonmagnetic intermediate layer 25, the free magnetic layer 26, the nonmagnetic intermediate layer 59, the pinned magnetic layer 63, the antiferromagnetic layer 64 and the current limiting layer 27 are continuously deposited on the first electrode layer 20 by sputtering, and then the portion of the multilayer film 43, which is not covered with the resist layer 44, is removed by ion milling in the same manner as the step shown in FIG. 8.

Then, the insulating layers 29, the bias underlying layers 30, the hard bias layers 31 and the insulating layers 32 are continuously deposited by sputtering on the first electrode layer 20 to be located on both sides of the multilayer film 43, and then the resist layer 44 is removed. Then, the second electrode layer 33 is formed on the insulating layers 32 and the current limiting layer 27.

In the above-described method of manufacturing a magnetic sensing element of the present invention, the current limiting layer 27 can easily be formed, and the effective element size can be effectively decreased. Therefore, a magnetic sensing element permitting improvement in reproduced output can be manufactured.

In the method of manufacturing a magnetic sensing element, the magnetic sensing element can be formed with the same track width Tw and the same length MRh in the height direction as a conventional element, and thus a magnetic sensing element having a decreased effective element size can easily be formed by a photolithography technique having the same degree of accuracy as a conventional technique.

A magnetic sensing element of the present invention can be used not only for a thin film magnetic head mounted on a hard disk device, but also for a tape magnetic head, a magnetic sensor, etc.

As described above, according to the present invention, a current limiting layer in which an insulating portion and a conductive portion are mixed is provided on the arrival side of a free magnetic layer, which a sensing current reaches, directly or through another layer.

Therefore, the sensing current flows perpendicularly in the current limiting layer. However, in the present invention, the current limiting layer provided on the arrival side of the free magnetic layer, which the sensing current reaches, directly or through another layer has a structure in which the insulating portion and the conductive portion are mixed, and thus the sensing current flows only through the conductive portion.

Therefore, the sensing current flowing to the free magnetic layer from an electrode layer through the current limiting layer locally flows only through the portion of the free magnetic layer, which corresponds to the conductive portion, to locally increase the current density of this portion.

Therefore, in the present invention, even when the free magnetic layer is formed with the same element area (referred to as the "optical element area") in the direction parallel to the film plane as a conventional element, the element area (referred to as the "effective element area") in which the sensing current actually flows through the free magnetic layer to be concerned in the magnetoresistive effect can be decreased. Therefore, even when a CPP type magnetic sensing element is formed in a large optical element size by using the photolithography technique having the same degree of accuracy as a conventional technique, the CPP type magnetic sensing element having high reproduced output can be formed.

Furthermore, the element size is substantially the same as a conventional element, and thus the magnetic sensing element can effectively sense an external magnetic field from a recording medium, thereby improving reproduced output and stability of the reproduced waveform.

What is claimed is:

1. A magnetic sensing element comprising a multilayer film comprising an antiferromagnetic layer, a pinned magnetic layer, a nonmagnetic intermediate layer and a free magnetic layer;
wherein a current flows perpendicularly to a film plane of each of the layers of the multilayer film, a current limiting layer comprising a mixture of an insulating portion and a conductive portion is provided on at least one of upper and lower surfaces of the free magnetic layer one of directly and through another layer, and the insulating portion of the current limiting layer comprises an insulating material layer having a plurality of holes provided therein to pass through at least the current limiting layer, and the holes are filled with a conductive material layer, which constitutes the conductive portion.

2. A magnetic sensing element according to claim 1, wherein the insulating material layer comprises one of an oxide film and a nitride film.

3. A magnetic sensing element according to claim 2, wherein the oxide film comprises an insulating material composed of an oxide of at least one of Al, Si, Ti, Zr, Hf, Cr, Ta, V, Nb, Mo, W, Fe, Ni and Co.

4. A magnetic sensing element according to claim 2, wherein the nitride film comprises an insulating material composed of a nitride of at least one of Al, Si, Ti, Zr, Hf, Cr, Ta, V, Nb, Mo, W, Fe, Ni and Co.

5. A magnetic sensing element comprising a multilayer film comprising an antiferromagnetic layer, a pinned magnetic layer, a nonmagnetic intermediate layer and a free magnetic layer,
wherein a current flows perpendicularly to a film plane of each of the layers of the multilayer film, and a current limiting layer comprising a mixture of an insulating portion and a conductive portion is provided on at least one of upper and lower surfaces of the free magnetic layer one of directly and through another layer, and the conductive portion of the current limiting layer comprises conductive grains which are dispersed in an insulating material layer constituting the insulating portion.

6. A magnetic sensing element according to claim 5, wherein the current limiting layer comprises a film structure in which microcrystal grains constituting the conductive portion and mainly composed of Fe are dispersed in an amorphous material constituting the insulating portion and containing a compound of one of O and N with at least one element M selected from Ti, Zr, Hf, Nb, Ta, Mo, W, and the rare earth elements.

7. A magnetic sensing element according to claim 6, wherein the current limiting layer has a composition represented by the formula $Fe_aM_bO_c$ wherein the composition ratios a, b and c by atomic % are $40 \leq a \leq 50$, $10 \leq b \leq 30$ and $20 \leq c \leq 40$ respectively, and satisfy the relationship a+b+c=100.

8. A magnetic sensing element according to claim 6, wherein the current limiting layer has a composition represented by the formula $Fe_dM_eN_f$ wherein the composition ratios d, e and f by atomic % are $60 \leq d \leq 70$, $10 \leq e \leq 15$ and $19 \leq f \leq 25$, respectively, and satisfy the relationship d+e+f=100.

9. A magnetic sensing element comprising a multilayer film comprising an antiferromagnetic layer, a pinned magnetic layer, a nonmagnetic intermediate layer and a free magnetic layer,
wherein a current flows perpendicularly to a film plane of each of the layers of the multilayer film, and a current limiting layer comprising a mixture of an insulating portion and a conductive portion is provided on at least one of upper and lower surfaces of the free magnetic layer one of directly and through another layer, and the insulating portion of the current limiting layer comprises insulating grains which are dispersed in a conductive material layer constituting the conductive portion.

10. A magnetic sensing element comprising a multilayer film comprising an antiferromagnetic layer, a pinned magnetic layer, a nonmagnetic intermediate layer and a free magnetic layer,
wherein a current flows perpendicularly to a film plane of each of the layers of the multilayer film,
a current limiting layer comprising a mixture of an insulating portion and a conductive portion is provided on at least one of upper and lower surfaces of the free magnetic layer one of directly and through another layer, the current limiting layer is provided at least on a current arrival surface of the free magnetic layer one of directly and through the other layer, and
the insulating portion of the current limiting layer comprises an insulating material layer having a plurality of holes provided therein to pass through at least the current limiting layer, and the holes are filled with a conductive material layer, which constitutes the conductive portion.

11. A magnetic sensing element according to claim 10, wherein the insulating material layer comprises one of an oxide film and a nitride film.

12. A magnetic sensing element according to claim 11, wherein the oxide film comprises an insulating material composed of an oxide of at least one of Al, Si, Ti, Zr, Hf, Cr, Ta, V, Nb, Mo, W, Fe, Ni and Co.

13. A magnetic sensing element according to claim 11, wherein the nitride film comprises an insulating material composed of a nitride of at least one of Al, Si, Ti, Zr, Hf, Cr, Ta, V, Nb, Mo, W, Fe, Ni and Co.

14. A magnetic sensing element comprising a multilayer film comprising an antiferromagnetic layer, a pinned magnetic layer, a nonmagnetic intermediate layer and a free magnetic layer, wherein a current flows perpendicularly to a film plane of each of the layers of the multilayer film, a current limiting layer comprising a mixture of an insulating portion and a conductive portion is provided on at least one of upper and lower surfaces of the free magnetic layer one of directly and through another layer, the current limiting layer is provided at least on a current arrival surface of the free magnetic layer one of directly and through the other layer, and the conductive portion of the current limiting layer comprises conductive grains which are dispersed in an insulating material layer constituting the insulating portion.

15. A magnetic sensing element according to claim 14, wherein the current limiting layer comprises a film structure in which microcrystal grains constituting the conductive portion and mainly composed of Fe are dispersed in an amorphous material constituting the insulating portion and containing a compound of one of O and N with at least one element M selected from Ti, Zr, Hf, Nb, Ta, Mo, W, and the rare earth elements.

16. A magnetic sensing element according to claim 15, wherein the current limiting layer has a composition represented by the formula $Fe_a M_b O_c$ wherein the composition ratios a, b and c by atomic % are $40 \leq a \leq 50$, $10 \leq b \leq 30$ and $20 \leq c \leq 40$, respectively, and satisfy the relationship $a+b+c=100$.

17. A magnetic sensing element according to claim 15, wherein the current limiting layer has a composition represented by the formula $Fe_d M_e N_f$ wherein the composition ratios d, e and f by atomic % are $60 \leq d \leq 70$, $10 \leq e \leq 15$ and $19 \leq f \leq 25$ respectively, and satisfy the relationship $d+e+f=100$.

18. A magnetic sensing element comprising a multilayer film comprising an antiferromagnetic layer, a pinned magnetic layer, a nonmagnetic intermediate layer and a free magnetic layer;

wherein a current flows perpendicularly to a film plane of each of the layers of the multilayer film, a current limiting layer comprising a mixture of an insulating portion and a conductive portion is provided on at least one of upper and lower surfaces of the free magnetic layer one of directly and through another layer, the current limiting layer is provided at least on a current arrival surface of the free magnetic layer one of directly and through the other layer, and the insulating portion of the current limiting layer comprises insulating grains which are dispersed in a conductive material layer constituting the conductive portion.

* * * * *

UNITED STATES PATENT AND TRADEMARK OFFICE
CERTIFICATE OF CORRECTION

PATENT NO. : 6,707,649 B2
DATED : March 16, 2004
INVENTOR(S) : Naoya Hasegawa et al.

It is certified that error appears in the above-identified patent and that said Letters Patent is hereby corrected as shown below:

Column 25,
Line 22, insert -- layer -- after "limiting"; and
Line 23, delete "layer", and combine paragraphs 3 and 4.

Signed and Sealed this

Thirty-first Day of January, 2006

JON W. DUDAS
*Director of the United States Patent and Trademark Office*